United States Patent
Katrašnik et al.

(10) Patent No.: US 11,835,583 B1
(45) Date of Patent: Dec. 5, 2023

(54) COMPUTER-IMPLEMENTED METHOD FOR DIAGNOSING STATES OF A BATTERY

(71) Applicant: Univerza V Ljubljani, Ljubljana (SI)

(72) Inventors: Tomaž Katrašnik, Maribor (SI); Klemen Zelic, Ljubljana (SI); Amer Amor Chowdhury Haque, Kamnica (SI); Ivo Pacnik, Prevalje (SI); Igor Mele, Borovnica (SI); Andraž Kravos, Ajdovščina (SI)

(73) Assignee: Univerza V Ljubljani, Ljubljana (SI)

( * ) Notice: Subject to any disclaimer, the term of this patent is extended or adjusted under 35 U.S.C. 154(b) by 0 days.

(21) Appl. No.: 17/829,968

(22) Filed: Jun. 1, 2022

(30) Foreign Application Priority Data

May 11, 2022 (EP) .................................... 22172864

(51) Int. Cl.
*G01R 31/367* (2019.01)
*G06F 30/27* (2020.01)
(Continued)

(52) U.S. Cl.
CPC ......... *G01R 31/367* (2019.01); *G01R 31/382* (2019.01); *G01R 31/392* (2019.01);
(Continued)

(58) Field of Classification Search
None
See application file for complete search history.

(56) References Cited

U.S. PATENT DOCUMENTS

| | | | |
|---|---|---|---|
| 10,263,447 B2 | 4/2019 | MirTabatabaei et al. | |
| 10,312,699 B2 | 6/2019 | Subbaraman et al. | |

(Continued)

FOREIGN PATENT DOCUMENTS

| | | |
|---|---|---|
| CN | 105974329 A | 9/2016 |
| CN | 106446520 A | 2/2017 |

(Continued)

OTHER PUBLICATIONS

Of Birkl (Diagnosis and Prognosis of Degration in Lithium-Ion Batteries, 2017, University of Oxford, Pembroke College, p. 1-177) (Year: 2017).*

(Continued)

*Primary Examiner* — Roy Y Yi
(74) *Attorney, Agent, or Firm* — Renner, Otto, Boisselle & Sklar, LLP

(57) ABSTRACT

A computer-implemented method of diagnosing one or more SoXs, such as State-of-Charge (SoC), State-of-Health (SoH), State-of-Energy (SoE), State-of-Power (SoP), State-of-Function (SoF) and State-of-Safety (SoS), of at least one battery, comprises a SoX diagnostics loop, which includes a given battery model, and a model update loop, which is configured to update the battery model, the method comprising:

receiving, by the SoX diagnostics loop from at least one sensor, at least one measured battery parameter of the battery, determining, by the SoX diagnostics loop, at least one SoX descriptor of the battery using at least one of the following: at least one SoX parameter, at least one comparison of the at least one SoX parameter: to its previous value, to the at least one another SoX parameter, to the at least one threshold value, wherein the at least one SoX parameter is one of the following: the at least one measured battery parameter, at least one simulated battery parameter provided by the battery model, the at least one state variable and at least one model parameter of the battery model, determining, by the SoX diagnostics loop, at least one SoX value associated with the SoX in dependence on the at least one of the following: SoX descriptor and SoX parameter, (Continued)

determining, by the SoX diagnostics loop, based on at least one of the following: the at least one SoX parameter, the at least one SoX descriptor and the at least one SoX value, whether an update is to be carried out on the model, in response to determining that the update is to be carried out, updating, by the model update loop, the battery model, and providing, by the model update loop, the updated battery model to the SoX diagnostics loop.

20 Claims, 2 Drawing Sheets

(51) Int. Cl.
    *G01R 31/392*     (2019.01)
    *H02J 7/00*     (2006.01)
    *G01R 31/382*     (2019.01)

(52) U.S. Cl.
    CPC .............. *G06F 30/27* (2020.01); *H02J 7/005* (2020.01); *H02J 7/0048* (2020.01)

(56) References Cited

U.S. PATENT DOCUMENTS

| | | | |
|---|---|---|---|
| 10,447,046 | B2 | 10/2019 | Ravi et al. |
| 10,686,321 | B2 | 6/2020 | Ravi et al. |
| 2011/0285356 | A1* | 11/2011 | Maluf ............... H02J 7/007184 320/139 |
| 2013/0335031 | A1 | 12/2013 | Joe et al. |

FOREIGN PATENT DOCUMENTS

| | | | |
|---|---|---|---|
| DE | 102013000572 | A1 | 7/2014 |
| DE | 102020210147 | A1 | 2/2022 |
| EP | 2233937 | A1 | 9/2010 |
| EP | 3842816 | A1 | 6/2021 |
| JP | 2017501374 | A | 1/2017 |
| LU | 101984 | B1 | 2/2022 |
| WO | 2020129477 | A1 | 6/2020 |
| WO | 2022069699 | A1 | 4/2022 |

OTHER PUBLICATIONS https://iisb-foxbms.iisb.fraunhofer.de/foxbms/gen1/docs/html/v1.6.0/software_documentation/modules/sox/sox.html) (Year: 2019).*
Celik, State of Charge Estimation for Lithium-Based Batteries, 2020, Ozyegin University, p. 1-61 (Year: 2020).*
Simone Barcellona et al.; Lithium Ion Battery Models and Parameter Identification Techniques; Energies; Dec. 1, 2017; pp. 1-24; vol. 10.
Md Ohirul Qays et al.; Active Cell Balancing Control Strategy for Parallelly Connected LiFePO4 Batteries; CSEE Journal of Power and Energy Systems; Jan. 2021; pp. 86-92; vol. 7, No. 1.
Luc H.J. Raijmakers et al.; Non-Zero Intercept Frequency: An Accurate Method to Determine the Integral Temperature of Li-Ion Batteries; IEEE Transactions on Industrial Electronics; May 2016; vol. 63, No. 5.
Kaveh Khodadadi Sadabadi et al.; Prediction of remaining useful life for a composite electrode lithium ion battery cell using an electrochemical model to estimate the state of health; Journal of Power Sources; 2021; pp. 1-10; vol. 481.
Christian Schlasza et al.; Review on the aging mechanisms in Li-ion batteries for electric vehicles based on the FMEA method; IEEE; 2014; pp. 1-6.
Aabhas Sharma et al.; Fisher Identifiability Analysis for a Periodically-Excited Equivalent-Circuit Lithium-Ion Battery Model; American Control Conference; Jun. 4-6, 2014; pp. 274-280.
Venkat Srinivasan et al.; Discharge Model for the Lithium Iron-Phosphate Electrode; Journal of the Electrochemical Society; 2004; pp. A1517-A1529; vol. 151.
Rengaswamy Srinivasan et al.; Early-Stage Heat- and Discharge-Induced Transformations in a Lithium-Ion Cell Monitored by an Advanced Battery Management System; Journal of the Electrochemical Society; 2022; vol. 169.
Xiaopgen Tang et al.; A method for state-of-charge estimation of LifePO4 batteries based on a dual-circuit state observer; Journal of Power Sources; 2015; pp. 23-29; vol. 296.
Yujie Wang et al.; A method for joint estimation of state-of-charge and available energy of LiFePO4 batteries; Applied Energy; 2014; pp. 81-87; vol. 135.
Zuolu Wang et al.; A review on online state of charge and state of health estimation for lithium-ion batteries in electric vehicles; Energy Reports; pp. 5141-5161; vol. 7.
Xuezhe Wei et al.; Practical On-Board Measurement of Lithium Ion Battery Impedance Based on Distributed Voltage and Current Sampling; Energies; Jan. 1, 2018; pp. 1-15.
Bing Xia et al.; Accurate Lithium-ion battery parameter estimation with continuous-time system identification methods; Applied Energy; 2016; pp. 426-436; vol. 179.
Rui Xiong et al.; Lithium-ion battery aging mechanisms and diagnosis method for automotive applications: Recent advances and perspectives; Renewable and Sustainable Energy Reviews; 2020; pp. 1-14; vol. 131.
Xiao-Guang Yang et al.; Modeling of lithium plating induced aging of lithium-ion batteries: Transition from linear to nonlinear aging; Journal of Power Sources; 2017; pp. 28-40; vol. 360.
Xiao-Guang Yang et al.; A look into the voltage plateau signal for detection and quantification of lithium plating in lithium-ion cells; Journal of Power Sources; pp. 251-261; vol. 395.
Hyan Woo You et al.; Analysis of equivalent circuit models in lithium-ion batteries; AIP Advances; Dec. 3, 2018; pp. 1-7.
Klemen Zelic et al.; Derivation of Transmission Line Model from the Concentrated Solution Theory (CST) for Porous Electrodes; Journal of The Electrochemical Society; 2021; vol. 168.
Yanhui Zhang et al.; A novel model of the initial state of charge estimation for LiFePO4 batteries; Journal of Power Sources; 2014; pp. 1028-1033; vol. 248.
Xiaoyu Zhang et al.; Anomaly Detection for Aviation Safety Based on an Improved KPCA Algorithm; Journal of Electrical and Computer Engineering; Mar. 16, 2017; pp. 1-8; vol. 2017.
Sara Abada et al.; Combined experimental and modeling approaches of the thermal runaway of fresh and aged lithium-ion batteries; Journal of Power Sources; 2018; pp. 264-273; vol. 399.
Harikesh Arunachalam et al.; What if the Doyle-Fuller-Newman model fails? A new macroscale modeling framework; IEEE Conference on Decision and Control (CDC); 2018; pp. 5702-5707; Miami, Florida, USA.
Peng Bai et al.; Charge transfer kinetics at the solid-solid interface in porous electrodes; nature communications; Apr. 3, 2014; pp. 1-7.
R. Bellman et al.; On Structural Identifiability; Mathematical Biosciences; 1970; pp. 329-339; vol. 7.
John Christensen et al.; A Mathematical Model for the Lithium-Ion Negative Electrode Solid Electrolyte Interphase; Journal of the Electrochemical Society; 2004; pp. A1977-A1988.
Guangzhong Dong; Online state of charge estimation and open circuit voltage hysteresis modeling of LiFePO4 battery using invariant imbedding method; Applied Energy; 2016; pp. 163-171; vol. 162.
Marc Doyle et al.; Comparison of Modeling Predictions with Experimental Data from Plastic Lithium Ion Cells; Journal of the Electrochemical Society; Jun. 1996; pp. 1890-1903; vol. 143, No. 6.
Van-Huan Duong et al.; Online state of charge and model parameters estimation of the LiFePO4 battery in electric vehicles using multiple adaptive forgetting factors recursive least-squares; Journal of Power Sources; 2015; pp. 215-224; vol. 296.
Ingvild B. Espedal et al.; Current Trends for State-of-Charge (SoC) Estimation in Lithium-Ion Battery Electric Vehicles; Energies; Jun. 4, 2021; pp. 1-24.

(56) References Cited

OTHER PUBLICATIONS

Fathima Fasmin et al.; Review—Nonlinear Electrochemical Impedance Spectroscopy; Journal of the Electrochemical Society; 2017; pp. H443-H455; vol. 164.
Xuning Feng et al.; A Coupled Electrochemical-Thermal Failure Model for Predicting the Thermal Runaway Behavior of Lithium-Ion-Batteries; Journal of The Electrochemical Society; 2018; pp. A3748-A3765; vol. 165.
Xinung Feng et al.; Thermal runaway mechanism of lithium ion battery for electric vehicles: A review; Energy Storage Materials; 2018; pp. 246-267; vol. 10.
Medhi M. Forouzan et al.; Modeling the Effects of Electrode Microstructural Heterogeneities on Li-Ion Battery Performance and Lifetime; Journal of The Electrochemical Society; 2018; A2127-A2144; vol. 165.
Miran Gaberscek; Understanding Li-based battery materials via electrochemical impedance spectroscopy; nature communications; 2021; pp. 1-4.
Peng Gao et al.; Equivalent circuit model analysis on electrochemical impedance spectroscopy of lithium metal batteries; Journal of Power Sources; 2015; pp. 67-74; vol. 294.
Xianzhi Gong; Modeling of Lithium-ion Battery Considering Temperature and Aging Uncertainties; University of Michigan—Dearborn, 2016.
M.A. Hannan et al.; A review of lithium-ion battery state of charge estimation and management system in electric vehicle applications: Challenges and recommendations; Renewable and Sustainable Energy Reviews; 2017; pp. 334-854; vol. 78.
Nina Harting et al.; Identification of Lithium Plating in Lithium-Ion Batteries using Nonlinear Frequency Response Analysis (NFRA); Electrochimica Acta; 2018; pp. 378-385; vol. 281.
Wei He et al.; A Physics-Based Electrochemical Model for Lithium-Ion Battery State-of-Charge Estimation Solved by an Optimised Projection-Based Method and Moving-Window Filtering; Energies; Aug. 14, 2018; pp. 1-23.
David A. Howey; Online Measurement of Battery Impedance Using Motor Controller Excitation; IEEE Transactions on Vehicular Technology; Jul. 2014; pp. 2557-2566; vol. 63, No. 6.
Xiaosong Hu; Battery Lifetime Prognostics; Joule; Feb. 19, 2020; pp. 310-346; vol. 4.
Mehdi Jafari; Deterministic models of Li-ion battery aging: It is a matter of scale; Journal of Energy Storage; 2018; pp. 67-77; vol. 20.
Joris Jaguemont et al.; Development of a Two-Dimensional-Thermal Model of Three Battery Chemistries; IEEE Transactions on Energy Conversion; Dec. 2017; pp. 1447-1455; vol. 32, No. 4.
Tomaz Katrasnik et al.; Entering voltage hysteresis in phase separating materials: revealing the thermodynamic origin of a newly discovered phenomenon and its impact on the electric response of a battery; pp. 1-83.
Tomaz Katrasnik et al.; Multi-scale modelling of Lithium-ion batteries: From transport phenomena to the outbreak of thermal runaway; Energy Conversion and Management; 2021; pp. 1-22; vol. 236.
Wonhee Kim et al.; Understanding electronic and Li-ion transport of LiNi0.5Co0.2Mn0.3O2 electrodes affected by porosity and electrolytes using electrochemical impedance spectroscopy; Journal of Power Sources; 2021; pp. 1-8; vol. 510.
Younghwi Ko et al.; A New SOC Estimation for LFP Batteries: Application in a 10 Ah Cell (HW 38120 L/S) as a Hysteresis Case Study; Electronics; 2021; pp. 1-14; vol. 10.
Aleksei La Rue et al.; Feature selection for state-of-charge estimation of LifePO4—Li4Ti5O12 batteries via electrochemical impedance; Jul. 1-3, 2020; pp. 231-236.
Oliver Lass; Parameter identification for nonlinear elliptic-parabolic systems with application in lithium-ion battery modeling; Springer; Feb. 28, 2015; pp. 217-239.
A. Latz et al.; Thermodynamic consistent transport theory of Li-ion batteries; Journal of Power Sources; 2011; pp. 3296-3302; vol. 196.
Arnulf Latz et al.; Multiscale modeling of lithium ion batteries: thermal aspects; Beilstein Journal of Nanotechnology; Apr. 20, 2015; pp. 987-1007; vol. 6.
N. Legrand et al.; Including double-layer capacitance in lithium-ion battery mathematical models; Jounral of Power Sources; 2014; pp. 370-378; vol. 251.
Jiahao Li et al.; A comparative study of state of charge estimation algorithms for LiFePO4 batteries used in electric vehicles; Journal of Power Sources; 2013; pp. 244-250; vol. 230.
Shuangqi Li et al.; Data driven battery modeling and management method with aging phenomenon considered; Applied Energy; 2020; pp. 1-9; vol. 275.
Jingxiao Li et al.; Transmission Line Model of Field-to-Wire Coupling with Transmission Line Cables from Near and Far Field Sources; IEEE; downloaded on Jul. 6, 2022.
Weihan Li et al.; Physics-informed neural networks for electrode-level state estimation in lithium-ion batteries; Journal of Power Sources; 2021; pp. 1-16; vol. 506.
Weihan Li et al.; Data-driven systematic parameter identification of an electrochemical model for lithium-ion batteries with artificial intelligence; Energy Storage Materials; 2022; pp. 557-570; vol. 44.
Xinfan Lin et al.; Analytic Bound on Accuracy of Battery State and Parameter Estimation; Journal of the Electrochemical Society; 2015; pp. A1879-1891; vol. 162.
M.S. Hossain Lipu et al.; Intelligent algorithms and control strategies for battery management system in electric vehicles: Progress, challenges and future outlook; Journal of Cleaner Production; 2021; pp. 1-27; vol. 292.
Zhentong Liu et al.; Structural analysis based sensors fault detection and isolation of cylindrical lithium-ion batteries in automotive applications; Control Engineering Practice; 2016; pp. 46-58; vol. 52.
Edoardo Locorotondo et al.; Online identification of Thevenin equivalent circuit model parameters and estimation State of Charge of Lithium-Ion Batteries; IEEE; 2018.
Igor Mele et al.; Advanced Porous Electrode Modelling Framework Based on More Consistent Virtual Representation of the Electrode Topology; Journal of the Electrochemical Society; 2020; vol. 167.
Jinhao Meng et al.; A Simplified Model-Based State-of-Charge Estimation Approach for Lithium-Ion Battery With Dynamic Linear Model; IEEE Transactions on Industrial Electronics; Oct. 10, 2019; pp. 7717-7727; vol. 66, No. 10.
Matthew D. Murbach et al.; Extending Newman's Pseudo-Two-Dimensional Lithium-Ion Battery Impedance Simulation Approach to Include the Nonlinear Harmonic Response; Journal of The Electrochemical Society; 2017; pp. E3311-E3320; vol. 164.
John Newman et al.; Porous-Electrode Theory with Battery Applications; AIChE Journal; Jan. 1975; pp. 25-41; vol. 21, No. 1.
Irene J. Ong et al.; Double-Layer Capacitance in a Dual Lithium Ion Insertion Cell; Journal of the Electrochemical Society; 1999; pp. 4360-4365; vol. 146.
Victoria Julia Ovejas et al.; Impedance Characterization of an LCO—NMC/Graphite Cell: Ohmic Conduction, SEI Transport and Charge-Transfer Phenomenon; Batteries; Sep. 10, 2018; pp. 1-22; vol. 4, No. 43.
Hui Pang et al.; Experimental Data-Driven Parameter Identification and State of Charge Estimation for a Li-Ion Battery Equivalent Circuit Model; Energies; Apr. 24, 2018; 1-14; vol. 11, No. 1033.
Saehong Park et al.; Optimal Experimental Design for Parameterization of an Electrochemical Lithium-Ion Battery Model; Journal of the Electrochemical Society; 2018; pp. A1309-A1323; vol. 165.
Carlos Pastor-Fernandez et al.; A Comparison between Electrochemical Impedance Spectroscopy and Incremental Capacity-Differential Voltage as Li-ion Diagnostic Techniques to Identify and Quantify the Effects of Degradation Modes within Battery management Systems, 2017; pp. 301-318; vol. 360.

* cited by examiner

COMPUTER-IMPLEMENTED METHOD FOR DIAGNOSING STATES OF A BATTERY

This application claims the priority of European Patent Application No. 22172864.5, filed May 11, 2022, which is hereby incorporated herein by reference in its entirety.

TECHNICAL FIELD

The invention relates to the technical field of battery management, and more particularly to a computer-implemented method for diagnosing states of a battery.

BACKGROUND

Insertion batteries and, in particular, lithium-ion batteries are widely used in portable, mobile and stationary applications. This broad range of applications shares several common objectives, which can be summarized as: higher energy and power density, prolonged life and increased safety of batteries. Additionally, this broad range of applications imposes several application-specific objectives, which cover operating temperatures, specific load profiles, and specific durability and safety criteria. Therefore, battery designs are to some extent tailored to specific applications. Hence, several types of active electrode materials, electrolytes, electron conducting materials, coatings and binders are used in the production of Li-ion batteries. Such a variety of materials also inherently reflects their different dynamics of main reactions, i.e. Li (de) intercalation dynamics, and even more pronounced differences in degradation and safety relevant side reactions.

In a real battery, the anode and cathode can be composed of an active material, an electron conductive material, an interface between the active material, electron conductive material and electrolyte and the electrolyte for each of the anode and cathode. In some batteries, a separator can further separate both electrodes (cathode and anode). Batteries with liquid electrolytes, in general, incorporate a separator hindering electron transfer, whereas in certain battery types, e.g. batteries with solid electrolytes, a specific separator is not needed, since electrolyte, e.g. ionic conductor, already acts also as a separator. In addition, batteries incorporate current collectors that end in battery terminals, which can, but need not, provide sensing areas for measuring electric parameters of batteries, if batteries are not equipped with specific intra-cell sensors. In addition, batteries might be equipped with specific intra-cell sensors, which provide additional information on intra-cell temperature and/or, pressure and/or species concentrations and/or electric parameters.

Battery performance, and safety, in particular, can crucially depend on the degradation phenomena, which occur at different time and length scales thus calling for advanced monitoring and diagnostics to ensure durable, efficient and safe operation of batteries. Batteries are subjected to several degradation phenomena (Schlasza C. et al., 2014 IEEE transportation electrification conference and expo (ITEC); IEEE, 2014. p. 1-6.), which have different implications ranging from capacity fade (influencing State-of-Charge (SoC)), increased internal resistance (influencing State-of-Power (SoP) and in combination with capacity fade State-of-Energy (SoE) and State-of-Function (SoF)), increased heat generation and various types of intra cell reactions leading to gas evolution of performance deterioration (influencing State-of-Safety (SoS), SoC, SoE, SoP, SoF), while all these plus multiple other indicators determine State-of-Health (SoH) of a battery.

To ensure durable and safe battery operation it is of importance to avoid unsafe operating conditions of batteries and to mitigate operating conditions that might lead to faster rate of battery degradation (where the term degradation covers all mechanisms and phenomena that might lead to decrease of battery performance and/or lead to increased probability of hazardous event). In addition, knowledge on the battery SoC, SoH, SoE, SoP, SoF and SoS is also important for planning its further primary use, while it is also a key parameter for indicating end of life (EoL) of its primary use and providing guidelines on suitability for its secondary use and refurbishing, dismantling, or recycling.

SoH and SoS but also SoE, SoP and SoF are namely significantly influenced by multiple degradation mechanisms, as for example growth of the solid-electrolyte interphase (SEI), lithium plating, cathode electrolyte interphase (CEI), micro cracking of active material, loss of electron wiring, gas evolution, delamination and others, as well as hazardous phenomena as for example separator penetration in batteries with liquid electrolytes, exothermic SEI regeneration and electrolyte as well as cathode decomposition, which can result in highly exothermic reactions, and others. Traditional battery management systems (BMS) mainly rely on voltage measurement (cell or pack level), current measurement (mostly pack level) and temperature measurement at one or several locations in pack. These battery parameters are traditionally processed with relatively simple models and decision-making algorithms, which limits their capability in detailed diagnosing of SoC, SoH, SoE, SoP, SoF and SoS. This imposes several challenges in managing battery operation in a way to avoid unsafe operating conditions of batteries and to mitigate operating conditions that might lead to faster rate of battery degradation.

The term battery management systems (BMS) denotes any electronic system that manages a rechargeable battery. However, it is generally associated with the electronic system that is constitutive part of the battery pack, which significantly narrows broad meaning of the battery management systems. To avoid this confusion, in the subsequent text the term battery management will be used to denote all types of systems that manage operation of batteries. This includes traditional battery management systems (BMS), which can for example be part of the battery pack, and any other types of distributed systems that interact with BMS or systems that exchange signals with the battery, e.g. any remote and cloud based solutions including digital twins.

The state-of-charge (SoC) estimation of a given battery is a very important parameter in a battery management (Hannan, et al., Renewable and Sustainable Energy Reviews 78, 834-854, 2017; Li, et al., Journal of power sources 230, 244-250, 2013; Tang, et al., Journal of Power Sources 296, 23-29, 2015; Ko, et al., Electronics 10, 705, 2021). However, in multiple cells it can be very challenging to estimate SoC with sufficient accuracy—as for example in lithium iron phosphate (LFP) or lithium titanate oxide (LTO) electrodes due to the flatness and hysteresis of the open circuit voltage (OCV) curve (Li, et al., Journal of power sources 230, 244-250, 2013; Tang, et al., Journal of Power Sources 296, 23-29, 2015; Ko, et al., Electronics 10, 705, 2021; Dong, et al., Applied Energy 162, 163-171, 2016; la Rue, et al., In 2020 American Control Conference (ACC), pp. 231-236, 2020). In addition, a classical approach of current integration (Coulomb counting) is also associated with challenges of accumulative error and inaccurate initial values (Li, et al., Journal of power sources 230, 244-250, 2013; Tang, et al., Journal of Power Sources 296, 23-29, 2015, la Rue, et al., In 2020 American Control Conference (ACC), pp. 231-236, 2020). Furthermore, Coulomb counting, which is a common approach in larger systems, can face further difficulties during transient operation, particularly when applied on multiple cells due to the inherent cell-to-cell variation which further aggravates with cell degradation. These challenges further aggravate when trying to determine the SoE and SoF, which is not only the integral of the current but also depends on the voltage which, in turn, includes the nonlinearity of Li-ion batteries (LIB) (Wang, e al., Applied energy 135, 81-87, 2014).

SoH can be obtained from estimating the open circuit voltage (OCV), which is dependent on SoC, and the internal resistance (Duong, et al., Journal of Power Sources 296, 215-224, 2015) being important health indicators in addition to the cell capacity (Wang, et al., Energy Reports 7, 5141-5161, 2021; Hu, et al., Battery lifetime prognostics. Joule 4, 310-346, 2020). However, these two health indicators are not directly measurable with commercially available sensors, and they tend to be indicated and estimated through other measured variables such as the voltage, current and temperature (Wang, et al., Energy Reports 7, 5141-5161, 2021). Due to listed facts and due to the fact that apparent DC cell resistance might significantly change at the same SoC and temperature due to different operation history of the cell (Katrašnik, T., et al. arXiv preprint arXiv:2201.04940, 2021) proper SoH diagnosis might be significantly compromised using current approaches.

Moreover, it is well known (Zhang, et al., Journal of Power Sources 248, 1028-1033, 2014), that the relaxation phenomena also influence the electric response of the cells. This is of a particular importance for the correct usage of electrochemical impedance spectroscopy (EIS) and interpretation of its results (Katrašnik, T., et al. arXiv preprint arXiv:2201.04940, 2021). EIS has been widely applied in the laboratories to obtain a profound insight into the phenomenology of the intra-cell phenomena (Gaberšček, Nature Communications 12, 1-4, 2021; Zelič, et al., Journal of The Electrochemical Society 168, 70543, 2021) and to assess battery SoH (Lipu, et al., Journal of Cleaner Production, 126044, 2021) or associated remaining useful life (RUL) (Zhang, et al., Nature communications 11, 1-6, 2020) and SoC (la Rue, et al., In 2020 American Control Conference (ACC), pp. 231-236, 2020; Howey, et al., IEEE transactions on vehicular technology 63, 2557-2566, 2013), where models can also be used together with EIS measurements for a better SoC and thus SoH estimation (Espedal, et al., Energies 14, 3284, 2021; Gao, et al., Journal of Power Sources 294, 67-74, 2015). In addition, it was shown in (Howey, et al., IEEE transactions on vehicular technology 63, 2557-2566, 2013; Wei, et al., Energies 11, 64, 2018) that EIS measurements on a vehicle could be made through cell excitation driven by the motor controller, while chips with EIS functionality are already commercially available (https://www.datangnxp.com/en/category/products/, accessed 05/2022) which brings EIS closer to future analysis, diagnostics and monitoring applications. However, reference (Katrašnik, T., et al. arXiv preprint arXiv: 2201.04940, 2021) clearly indicate that the low-frequency part of impedance response changes drastically at the same SoC and temperature based on the cells' history, making even this quite sophisticated EIS method of limited applicability to accurately diagnose SoH of selected cell chemistries with just a single method. Although EIS methods are information-rich, it is very time consuming to investigate the entire frequency spectra, therefore in real applications it is very important to properly select frequency ranges for analysing specific phenomena.

Another challenging aspect in multi cell system is also cell balancing of serially and parallelly connected cells, where balancing algorithms require inputs of at least voltage, current and temperature (Lipu, et al., Journal of Cleaner Production, 126044, 2021; Qays, et al. CSEE Journal of Power and Energy Systems 7, 86-92, 2020). During fast charging and, consequently, low current balancing procedure cells can due to slight cell-to-cell variation and thus related different cell histories yield different cell voltages at the same SoC and temperature (Katrašnik, T., et al. arXiv preprint arXiv:2201.04940, 2021), which impairs the balancing procedure despite availability of measured parameters that are acquired by the BMS.

To support BMS functionalities, models are frequently applied in BMS systems. There exist several types of battery models, where unlike atomistic and mesoscopic models, which are applied at lower scales, continuum models are generally applied to model batteries. Within continuum models, it is possible to distinguish between physicochemically consistent models and models that do not feature physicochemical consistency. The first group of physicochemically consistent models of insertion batteries is based on governing equations that model, in a mechanistic manner, processes in insertion batteries and which rely on model parameters that are related to either intrinsic material properties and topological as well as geometric properties of batteries and their constitutive parts as for example elementary electrochemical cells composed of cathode, anode and in the general also electrolyte, while batteries with liquid electrolyte feature also separators. This type of models generally originates from the porous electrode theory-based models proposed in refs. (Newman and Tiedemann, AIChE Journal 21, 25-41, 1975; Doyle, et al., Journal of the Electrochemical Society, 143(6), 1890, 1996; Srinivasan, et al., Journal of the Electrochemical Society 151.10: A1517, 2004) and various types of their upgrades and extensions with models for simulating additional effects as for example double layer capacitance (Ong, et al., Journal of The Electrochemical Society 146.12: 4360, 1999), more detailed description of electrode topologies (Mele, et al., Journal of The Electrochemical Society 167, 60531, 2020), degradation effects (Christensen and Newman, Journal of The Electrochemical Society 151.11: A1977, 2004; Yang, et al., Journal of Power Sources 360: 28-40, 2017; Katrašnik, et al., Energy Conversion and Management 236: 114036, 2021), heat generation (Katrašnik, et al., Energy Conversion and Management 236: 114036, 2021; Feng, et al., Journal of The Electrochemical Society 165.16: A3748, 2018; Abada, et al., Journal of Power Sources 399: 264-273, 2018; Arunachalam, et al., 2018 IEEE Conference on Decision and Control (CDC). IEEE, 2018, or with more detailed models of specific phenomena like for example redox reactions (Bai and Bazant, Nature communications 5.1: 1-7, 2014).

Unlike, physicochemically consistent models, models that do not feature physicochemical consistency feature model parameters that are not uniquely related to either intrinsic material properties or geometric properties of batteries and their constitutive parts. In addition, this type of models is, in general, not based on governing equations that model in a mechanistic manner processes in insertion batteries, which might result also in the fact that states of such models do not, or do not fully, coincide with states of a real insertion battery; illustrative non-restrictive examples might be electrode potentials, temporary resolved lithiation level of electrodes or even temporary and spatially resolved lithiation level of electrodes and others. This type of models comprises, but are not limited to, a large group of data driven models (Li, et al., Applied Energy 275: 115340, 2020; Pang et al., Energies 11.5: 1033, 2018), including models that predict battery performance or degradation with machine learning or in a broader sense artificial intelligence, empirical models, look-up tables (e.g. (Jaguemont, et al., IEEE Transactions on Energy Conversion, 32.4: 1447-1455, 2017)) or simple algebraic expressions (e.g. (Zhang, et al., International Journal of Electrical and Computer Engineering, 11.3: 277-282, 2017)).

Multiple equivalent circuit models (ECM), in particular, the ones applied in traditional BMSs, fall within the category of models that do not feature physicochemical consistency, which can, in general, be associated with not consistent mapping between equivalent circuit topology and underlying processes in real batteries. This lack of physicochemical consistency can generally be associated with an empirical origin of the models, which were postulated with the purpose of elaborating the simplest equivalent circuit topology that enables executing envisaged tasks. The illustrative examples are Thevenin ECs with one, two and three RC pairs (Locorotondo, et al., 2018 IEEE International Conference on Environment and Electrical Engineering and 2018 IEEE Industrial and Commercial Power Systems Europe (EEEIC/I&CPS Europe). IEEE, 2018; Pang, et al., Energies 11.5: 1033, 2018; You, et al., AIP Advances 8.12: 125101, 2018) and Norton equivalent circuits (Li et al., Asia-Pacific International Symposium on Electromagnetic Compatibility (APEMC). IEEE, 2021) Thevenin and Norton equivalent circuits as well as their derivatives do, topology wise, not virtually represent one of the main features of the insertion batteries being the finite charge that can be transferred between the electrodes, as it is possible to find the path between the positive and negative connector of the battery that does not include an element with finite capacity, which is an inherent characteristic of the battery. Due to missing physicochemical consistency, elements and time constants of these circuits cannot be uniquely associated with the underlying battery phenomena. Furthermore, when model topology lacks physicochemical consistency, parameters of the DC equivalent of a circuit can generally not be (directly) used/transferred to the AC equivalent of a circuit to adequately simulate the AC response of the battery. All listed features significantly limiting application of such type of models for detailed SoX diagnostics.

Models that do not feature physicochemical consistency are frequently characterized by low computational expense and, thus, high computational speed. However, this type of models is capable to virtually replicate battery performance only under the specific conditions under which they were parameterized. Therefore, these models feature limited applicability when applied outside parametrized voltage or capacity range, at extreme ambient conditions and, in particular, for degraded cells. Theoretically, it would be possible to generate parametrization cases for a very wide range of voltage or capacity and temperature ranges at the expense of unreasonably high cost and effort of parameterization. However, as different cells feature different long-term histories, which provoke different degradation phenomena, it is not possible to a-priori investigate the design space that would allow for efficient parameterization over the entire lifetime of the battery. These shortcomings might also significantly limit the operating conditions, which are suitable for estimating states or parameters of the model (WO 2022/069699 A1). These challenges are sometimes approached by introduction of models featuring multiple modelling structures, i.e. topologies, in different SoC regions or for aged cells. But, such models impose even bigger challenges in terms of stability and convergence of observers, as both model structure and model parameters need to be adapted.

In addition to ECMs that do not feature physicochemical consistency, there exists also ECM that feature physicochemical consistency. References (WO 2022/069699 A1, Zelič, et al., Journal of The Electrochemical Society 168.7: 070543, 2021) disclosures a method which enables full mapping between governing equations of the porous electrode-based model (Newman & Tiedemann, AIChE Journal, 21.1: 25-41, 1975; Ong & Newman, Journal of The Electrochemical Society, 146.21:4360, 1999) and equivalent circuit model (WO 2022/069699 A1). In addition, as disclosed in WO 2022/069699 A1, this equivalent electric circuit model can be derived in such a way that it is consistent with physiochemical processes in the real battery. Due to consistency with physiochemical processes in real batteries, elements of the equivalent circuit model, which virtually represent the battery, can replicate specific processes in batteries, and due to a possible consistency with electrochemical models, circuit elements of such an equivalent circuit can be analytically derived from, or can be associated with parameters that are related to, material and topological as well as geometrical properties of the batteries.

Knowledge on the open circuit voltage (OCV) is, in general, very important for adequate battery management. WO 2020/129477A1, JP2017501374A and JP2015527566A disclose a method for battery state estimation device, a battery state estimation method, and a battery system that estimates a state of a battery cell such as a lithium ion battery. More specifically, it discloses a method for modelling a secondary battery with an equivalent circuit of OCV, a negative electrode, a positive electrode, and diffusion, estimating polarization (diffusion) characteristics, and estimating OCV. Despite indication that a control unit that estimates an OCV of the battery cell is based on an equivalent circuit model, which is based on the electrochemistry of the battery cell, the model does not feature very high consistency to the physiochemical processes in real batteries. This not very high consistency to the physiochemical processes in real batteries is discernible mainly through non appropriate positioning of the double layer capacitance that should be connected in parallel to the half redox reaction at each of the electrodes or electrode specific OCV as denoted in the WO 2020/129477A1, and due to the fact that at least one conductor that comprises only resistors and voltage sources exist in the model, which means that, in general, there is not a finite capacity in the battery.

SoC is another important input for battery management. Several references indicate that application of physics based or physicochemically consistent models enable plausible SoC estimation (He, et al., Energies 11.8:2120, 2018; U.S. Ser. No. 10/686,321B2), while application of models that do not feature physicochemical consistency might feature certain limitations when estimating SoC. This statement is supported by the fact that applying models that do not feature physicochemical consistency may result in inaccurate estimation of particular states or inaccurate identification of particular parameters, since the value is determined using the models which may not fully account for all possible transient current and voltage values that are measured during operation of the battery pack. Such a deficiency is in ref. (U.S. Ser. No. 10/312,699B2) exposed for the determination of OCV and the applied ECM that does not feature physicochemical consistency. Since, as exposed in (U.S. Ser. No. 10/312,699B2), if the OCV of the battery cannot be determined accurately, then the inaccurate OCV value can reduce the accuracy of estimating the SoC and SoH of the battery.

SoH, being another important input for battery management, is frequently associated from estimated the OCV (U.S. Ser. No. 10/312,699B2), the internal resistance (Duong, et al., Journal of Power Sources 296, 215-224, 2015; EP2233937A1), and the cell capacity (Wang, et al., Energy Reports 7, 5141-5161, 2021; Hu, et al., Joule 4, 310-346, 2020; Sadabadi, et al., Journal of Power Sources 481: 228861, 2021; U.S. Ser. No. 10/312,699B2). SoH can, for example, be determined by acquiring SoH value from the pre-established database (CN106446520A) by comparing total charge capacity and a predetermined capacity change threshold to characterize the influence of the cyclic charge of the battery pack on its attenuation (EP3842816A1); by estimating the SoH of the battery pack through double adaptive extended Kalman filtering algorithm estimating battery Ohm inner resistance and battery charge state online through two independent Kalman filters and reflecting the SoH of the battery through change of the battery Ohm inner resistance (CN105974329A); and by application of physicochemically consistent models.

For proper functioning of the models in battery management applications, it can be important to adequately parametrize the models. Reference (DE102013000572A1) discloses a method to determine the model parameters of such a model via determining model parameters of electrochemical energy storage of e.g., electric vehicle, involving defining parameter record variant as new reference dataset to describe battery model and to determine maximum power of storage. However, applied model does not feature physicochemical consistency, which combined with limited set of determined parameters and measured dataset limits applicability of such an approach for SoX prognosis.

Reference (U.S. Ser. No. 10/686,321B2) proposes systems and methods, based on the physics-based battery or physicochemically consistent model, for implementing a BMS that estimates and predicts various states of the battery by applying, for example, an extended Kalman filter, claiming estimation, by the battery management system, a SoC of the at least one battery cell at a first time by applying an electrochemical battery model, without specifically disclosing SoH functionalities. Similarly, ref. (U.S. Ser. No. 10/263,447B2) proposes systems and methods, based on the physics-based battery or physicochemically consistent model, for managing the operation of a battery management system that estimates various states and parameters of a battery using a Moving Horizon Estimation method, without specifically disclosing SoH functionalities.

Physicochemically consistent models of batteries can involve complex mathematical models which are computationally expensive to process, which poses a problem for identification of large set of parameters involved in the physicochemically consistent models. One of the solutions proposed in ref. (U.S. Ser. No. 10/263,447B2) is to apply Reduced Order Model (ROM), which feature certain deficiencies as for example the frequency response of ROM can significantly deviate in certain frequency response regions, which impairs ability of ROM to exhibit full EIS functionality. Another approach proposed in ref. (U.S. Ser. No. 10/447,046B2) relies on reducing the computational load placed on the local battery management system in a way that the estimation and identification of the various states and parameters of the model can be distributed between the local BMS and a remote calculating system, i.e. the parameter estimator.

Several methods, e.g. (DE102020210147A1, LU101984B1) rely also on artificial intelligence, to determined various battery indicators including SoH based on voltage measurements, which in ref. (DE102020210147A1, LU101984B1) relate to charging conditions, whereas disclosed procedure assesses only differences in nominal capacity, while it is not capable of extracting intracell parameters that are required for advanced SoX diagnostics.

Listed challenges are further aggravated when more complex SoX diagnostic methods, as for example SoS are developed using models that do not feature physicochemical consistency, as in such cases states and parameters, in general, cannot be correlated with specific battery health critical and consequently battery safety relevant processes with sufficiently high certainty. Simple SoH indication based on OCV, variation of internal resistance or capacity fade does namely not directly diagnose for example very thick solid electrolyte interface (SEI), which does not result only in the capacity fade and reduced porosity but represents a severe safety threat if battery is overheated, as it might initiate thermal runaway of the cell (Feng, et al., Energy Storage Materials 10: 246-267, 2018; Feng, et al., Journal of The Electrochemical Society 165.16: A3748, 2018; Katrašnik, et al., Energy Conversion and Management 236: 114036, 2021). Likewise, for example, Li-plating, which can also represent severe safety threat, cannot be uniquely diagnosed with listed methods. Moreover, some other faults as for example gas evolution might also not be detected with listed methods sufficiently fast to prevent hazardous outcome.

Therefore, in this application, it is distinguished between determination of specific parameters, as for example variation of OCV and internal resistance or capacity fade, that are used as indicators, and diagnosing of SoX. The term diagnosing is thus used to denote identification of the nature of a problem by examination of the symptoms, where for batteries symptoms represent changes of battery states or parameters which pinpoint a specific degradation mechanism. Exemplary, increased battery resistance is a frequent indicator for reduced SoH, whereas, in general, just knowledge on this SoH indicator does not reveal the underlying degradation mechanism. Therefore, if exemplarily thickening of the SEI would be the origin of this increase in battery resistance, a symptom for this indicator might be variation of impedance in the specific frequency range of the EIS spectrum, which can pinpoint growth of the SEI (Ovejas, et al., Batteries 4.3: 43, 2018) and thus contributing to diagnose SoH and also to diagnose SoS. Thus, unlike simple indication, diagnosing establishes causal chain of interactions, which enables managing a battery in a way to avoid unsafe operating conditions of batteries and to mitigate operating conditions that might lead to faster rate of battery degradation.

Importance of diagnosis and limitations of using simple indicators can be illustratively presented on an example of the non-unique mapping between SoH and SoS. Capacity fade is another frequent indicator of reduced SoH. However, without diagnosing underlying symptoms and thus establishing causal interrelation, it is not possible to elaborate its impact on the SoS. If, for example, capacity decreases due to formation of SEI and/or plating of metallic lithium and/or formation of Li dendrites SoS is also reduced. However, if less energy is stored in a battery due to, for example, deposition of dead lithium and/or loss of electron or ion wiring or some other effect that is not related to safety critical mechanisms, SoS of such a cell can even be increased. Therefore, holistic SoX diagnosis requires more complex computational procedures compared to application of current SoC or SoH indicators.

Additional challenges related to diagnosing of SoX arise from the poor identifiability of the model parameters caused by nonlinearities, redundant definitions, intertwined physical phenomena and time-scale separations in battery dynamics (Li, et al., Energy Storage Materials 44: 557-570, 2022; Sharma, et al., 2014 American control conference. IEEE, 2014), which calls for specific approaches and methods to diagnose SoX. Moreover, the nonlinearities and the time scale separation in the battery model may cause some parameters only identifiable at a specific frequency (Meng, et al., IEEE Transactions on Industrial Electronics 66.10: 7717-7727, 2018; Sharma, et al., 2014 American control conference. IEEE, 2014).

References, as for example (Pastor-Fernandez, et al., Journal of Power Sources 360: 301-318, 2017; Xiong, et al., Renewable and Sustainable Energy Reviews 131: 110048, 2020), present several approaches to pinpoint a specific degradation mechanism from the measurement of the EIS spectra. However, these experimental results are analysed using ECM model that do not feature physicochemical consistency. In addition, these models cannot be used to adequately model batteries in the DC domain. These features several challenges for application of such approaches in diagnosing SoX during battery operation. As exposed previously, applying models that do not feature physicochemical consistency may result in inaccurate estimation of particular states or inaccurate identification of particular parameters, since their values are determined using models that may not fully account for all possible transient current and voltage values that are measured during operation of the battery pack (U.S. Ser. No. 10/312,699B2). This is further supported by ref. (Pastor-Fernandez, et al., Journal of Power Sources 360: 301-318, 2017) stating that there is no unique method to relate resistances of the applied Adapted Randles ECM with the effects of degradation mechanisms. In addition, in the proposed set-up EIS measurements need to be performed using low amplitude voltage or current signals to avoid exciting the nonlinear impedance characteristics of the cell, whereas these low amplitude signals can be easily perturbed by noise and so the corresponding impedance measurement may not be accurate, which limits applicability of the proposed approach. Furthermore, models applied to analyze EIS spectra in (Pastor-Fernandez, et al., Journal of Power Sources 360: 301-318, 2017; Xiong, et al., Renewable and Sustainable Energy Reviews 131: 110048, 2020) cannot be used for modelling DC battery operation and thus also managing batteries during battery cycling, while parameters of such models cannot be directly transferred to models applied to manage batteries during battery cycling.

To resolve this challenge, the present invention relates to a a computer-implemented method for diagnosing SoX, which is based on a single underlying physicochemically consistent model using identical model parameters when processing data measured in the DC and/or AC domain.

SUMMARY

Preferred aspects and embodiments of the present invention are described in the attached claims.

Furthermore, a summary of some embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present invention relates, in one aspect, to a computer-implemented method of diagnosing a SoX, in particular State-of-Charge (SoC), State-of-Health (SoH), State-of-Energy (SoE), State-of-Power (SoP), State-of-Function (SoF) and State-of-Safety (SoS), of at least one battery. The method comprises two loops: 1. a SoX diagnosing loop and 2. a model update loop.

In a non-restrictive example embodiment, the method of diagnosing a SoX can be carried out on a device for diagnosing SoX, which consists of an embedded computer with at least one microprocessor, which can be standard or strictly dedicated HW, and is connected to a local data warehouse, a hardware measuring interface, a hardware communication interface for long-distance wireless communication, and a hardware communication interface for wired and wireless communication with nearby devices.

SoX values are determined using at least one of the following: SoX descriptor and SoX parameter and none or at least one of the following: mechanistically or physically based methods, including physicochemically consistent battery model, machine learning methods, artificial intelligence, and any combination of these methods as well as any type of optimization methods and comparative algorithms. During this procedure, measured battery parameters are obtained by sensors, while simulated battery parameters are calculated using a given battery model, which is preferably a physicochemically consistent model. The given battery model may also be used to estimate state variables and all these parameters, including model parameters may be used to calculate SoX descriptors that may be used in determining SoX values.

In some embodiments, one or more SoX values can be determined based on at least one of the following: the at least one SoX parameter and the at least one SoX descriptor, values of previous SoX values, at least one parameter from the battery control unit or control unit of the system, in which the battery is integrated. If required by the specifics of determining SoX parameters, SoX descriptors and SoX values, a processing engine comprising at least one of the following: mechanistically based methods, including physicochemically consistent battery model, machine learning methods, artificial intelligence and any combination of these methods as well as any type of optimization methods, can be used during these procedures.

In some embodiments, estimating state variables of the physicochemically consistent battery model is performed using, for example Kalman filters or any other, method for estimation of at least one state variable and/or identification of at least one model parameter.

In some embodiments, the SoX diagnostics loop is configured to determined value of at least one SoX, which means that a previous SoX value is redetermined to more adequately reflect actual state of the physical battery. SoX diagnostics also incudes but is not limited to carrying out, by the SoX diagnostics loop, none or at least one of the following: estimating one or more state variables, pinpointing at least one specific degradation mechanism of the battery, identifying inappropriateness of at least one model parameter and identifying inappropriateness of the model structure.

In some embodiments, as it is from the cost and resources perspective unreasonable to continuously perform determination of all SoX parameters and diagnostics of all SoX, SoX diagnostics loop may incorporate one or more decision making algorithms that decide, which SoX needs to be updated. A decision-making module configured to determine which SoX value needs to be updated, uses one or more inputs, namely SoX descriptors; processing engine comprising at least one of the following: mechanistically based methods, including physicochemically consistent battery model, machine learning methods, artificial intelligence and any combination of these methods as well as any type of optimization methods; triggering from any battery control unit or control unit of the system, in which battery is integrated; predetermined SoX update sequence (e.g. predetermined update frequency); to determined which SoX value needs to be updated.

In some embodiments, the SoX diagnosing loop provides parameters that are used as criteria to evaluate if model needs to be updated. These criteria can be composed of SoX parameters, SoX descriptors, SoX values and any combination thereof. Hence, within the SoX diagnosing loop a need to update or check the battery model is determined based on model update criteria that are determined at least in accordance with one of the following: SoX parameters, SoX descriptors, SoX values, while additionally, pinpointed specific degradation mechanism, identified inappropriateness of model parameters or identified inappropriateness of the model structure can be used to update the model or to check the model, if it is still adequate to simulate the battery processes in envisaged operating conditions of the battery. In addition, it is possible to trigger model update of check through external triggers and inputs to model update strategy from, as for example any battery control unit or control unit of the system, in which battery is integrated, and predetermined model update sequence.

In some embodiments, a method comprises model update module, which is configured to determine a model update strategy for updating the battery model, which is an instrumental part of the model update loop. This method is configured to determine model update strategy using autonomous decision-making algorithm, which is configured to autonomously identify, which state variables and model parameters as well as model structure or any combination thereof need to be updated. This autonomous decision-making algorithm using at least one of the following: measured battery parameter, simulated battery parameter, state variable, model parameter, i.e. SoX parameters, and, SoX descriptors and SoX values; processing engine comprising at least one of the following: mechanistically or physics based methods, for example physicochemically consistent battery model, machine learning methods, artificial intelligence and any combination of these methods as well as any type of optimization methods. It is also possible to determine model update strategy using external triggers and inputs to model update strategy from: any battery control unit or control unit of the system, in which battery is integrated; and predetermined model update sequence, which can in an illustrative non-restrictive example comprise a predetermined update frequency. A goal of the model update loop can be to generate a model that more accurately virtually replicates battery processes, e.g. performance, to enable better control and monitoring of the battery. As models might be complex, it is from the computational perspective not always necessary to carry out identification of all model parameters, estimation of all model states and investigation of all relevant model structures, as this would be very computationally demanding and would require a lot of data. Therefore, one of the instrumental parts of the model update strategy relates to as accurate as possible identification of model parameters, state variables and the model structure that need to be updated.

In some embodiments, as all data to update the model might not be available in the databases (in the battery management system, cloud, digital twin . . . ) it might be necessary to execute additional measurements to adequately update the model. Therefore, it is, based on the requirements of the model update strategy and based on the available data, in the model update loop, decided whether no measurement or at least one measurement of at least one battery parameter is to be carried out within the model update loop.

In some embodiments, the model update strategy, therefore, can determine special or tailored measurements and data acquisition that need to be performed to most efficiently update the model. This includes a wide range of potential measurements that can be performed only on demand, using special or tailored excitation sequences, with an aim to optimize use of resources. Such measurements might comprise, but are not limited to, adapting AC measurements in terms of the shape of the signal, frequency range, amplitude and duration of the measurement procedure as well as its superimposition on any type of DC signal with an objective to extract most information and to enable execution of model update measurements during normal battery operation. Likewise, this might include updating DC measurements in terms of the duration of the measurement procedure with an objective to extract most information and to enable execution of model update measurements during normal battery operation. At least in some embodiments, the determination whether no measurement or at least one measurement of at least one battery parameter is to be carried out within the model update loop is carried out using at least one of the following:

- availability of data stored in the any of the databases available to the device, which is configured to execute the claimed method,
- the at least one SoX parameter, the at least one SoX descriptor, or the at least one SoX value,
- a processing engine incorporated in or accessible by the SoX diagnostics loop, wherein the processing engine comprising at least one of the following: mechanistically or physically based models, for example a physicochemically based battery model, machine learning methods, artificial intelligence or any combination of these as well as any type of optimization methods,
- external triggers and inputs to the model update module from any battery control unit or control unit of the system, in which battery is integrated.

At least in some embodiments, following the model update strategy and using measured data, either from the database or from newly conducted measurements, the model update loop is configured to perform at least one of the following model update tasks: identification of model parameters, estimation of state variables, a battery model structure update. These tasks are executed in the model update module, which is configured to update the battery model according to the model update strategy, wherein the model update strategy is executed using, for example, the battery model and optimization methods, or machine learning, or artificial intelligence or any combination thereof to identify model parameters, estimate state variables, update battery model structure according to the model update strategy, where all or only some of these tasks are carried out in accordance with the model update strategy. Model update strategy is determined using at least one of the following: the at least one SoX parameter, the at least one SoX descriptor, or the at least one SoX value; a processing engine incorporated in or accessible by the SoX diagnostics loop, wherein the processing engine comprising at least one of the following: mechanistically or physically based models, for example a physicochemically based battery model, machine learning methods, artificial intelligence or any combination of these as well as any type of optimization methods. In addition, this procedure can use also parameters from a battery control unit or a control unit of the system, in which battery is integrated or a combination of listed inputs.

In some embodiments, the model is parametrized with a model parameter identification procedure that represents any optimization method that is capable of finding global minimum of the system of equations imposed by the physicochemically consistent battery model through variation of its model parameters. The parametrization method relies on adequate measured battery data represents any set of DC and AC data that contains sufficient information to determine with high level of accuracy and uniqueness some or all of the required parameters and SoX values.

In some embodiments, the method is configured to carry out a battery model structure setup with battery model parameter identification and model conversion on at least one of the following: local hardware with appropriate data support, and adequate artificial intelligence methods for complex nonlinear battery modelling, and remote processing backend, where optimization methods and machine learning algorithms procedures are carried out. Parameter identification procedure and model structure setup procedure might use any measured and/or calculated datasets of battery parameters, which are stored in the database and/or which are stored in memory and/or newly triggered measurements of any number of battery parameters in the direct (DC) or alternating current (AC) domain. Data can be used in raw form, or they can be filtered and subjected to procedure of selecting data, assessing trustworthiness of data.

In some embodiments, this procedure is supported by the model selection procedure, which comprises at least one of the following:
  performing the automatic conversion of an identified non-linear electrochemical battery model into a family of substitutions linearized battery models using different methods including but not limited to balanced realisation, automatically verifying the specific properties of substitutions models such as model controllability, observability,
  using their respective Gramians, frequency characteristic, and stability, using mathematical metrics, for example Hinf, H2, Linf and LQG, for comparative criteria when selecting the optimal substitution battery model,
  automatically calculating or determining one or more associated observers for the selected model according to the needs of SoX calculations for the battery.

In some embodiments, after the model is updated in the model update loop and after described model conversions as well as comparative algorithms are executed (FIG. 1, 111), are performed the model is, in the model update loop, checked before such an updated model is given to the SoX diagnostics loop. There are plurality of checks that can be performed and their exact formulation will depend on specific application. Therefore, in some embodiments, determining model criteria and executing comparative algorithms is crucial to evaluate if model criteria are fulfilled and if updated model can be given to the SoX diagnostic loop.

In some embodiments, if all application specific criteria are fully filled, the model is, from the model update loop, given to the SoX diagnostics loop, wherein the SoX diagnostics loop uses the present battery model until the updated model is provided by the model update loop to the SoX diagnostics loop, wherein the updated model replaces the present battery model in the SoX diagnostics loop.

In some embodiments, the method uses a mechanistic or physically based battery model, for example physicochemically consistent, battery model, which represents any model that models transport and electrochemical and, if relevant, heat generation and degradation phenomena and enables, in combination with, model parameter identification procedure and adequate measured battery data in time and/or in frequency domain, to determine with high level of accuracy and uniqueness SoX relevant parameters of insertion batteries comprising at least one of the following: amount of cyclable Li, i.e. capacity, open circuit voltage, overpotentials associated with surface reactions and various transport mechanism as well as parameters inherently contributing to these overpotentials, which covers at least one of the following: exchange current densities, diffusivities, electric conductivities, transference numbers and potential additional parameters, stoichiometry range of electrodes, amount of active material, size of active aggregates or agglomerates of active particles, porosity, tortuosity and potential additional parameters.

In some embodiments, mechanistic or physically based, for example physicochemically consistent, battery model incorporates also non-linear effects and it is thus capable of modelling nonlinear characteristics of the cell in AC and DC domain, which is important for diagnostics during battery operation. Said feature is crucial to ensure that a single model with identical model parameters can be used to determine all relevant SoX values. This is related to the fact that certain parameters indicating specific SoX characteristics of batteries cannot be uniquely identified with only DC or only AC measurements, while, in addition, it is for example not always possible to perform DC measurements, whereas due to cost limitations execution of AC measurements and/or range and accuracy of AC measurements might be limited. Therefore, it is crucial to use a single underlying physicochemically consistent model using identical model parameters when processing data measured in the DC and/or AC domain. With such an approach the difference in model parameters and state variables can be assigned to a particular process or potentially hazardous operating condition and thus to a particular deviation used to diagnose SoX through determining SoX values.

In some embodiments, the computer-implemented method for diagnosing states of a battery can be executed on any independent device and/or part of BMS and/or a digital twin (DT) and/or a remote, e.g. cloud based, service and/or any other product and/or application and/or service to enable enhanced battery control and/or prolong battery service life and/or improve battery safety and/or enhance its performance and/or provide inputs for second life application of batteries, avoid unsafe operating conditions of batteries and mitigate operating conditions that might lead to faster rate of battery degradation. In some embodiments, the method can thus be executed on at least one of the following: a single physically integrated hardware, more distributed hardware systems and systems including remote, e.g. cloud, services. Likewise, data can be stored on at least one of the following: a single physically integrated hardware, more distributed hardware systems and systems including remote, e.g. cloud, services. Therefore, proposed method can be, in any of the devices, where it is applied, either carried out on a dedicated hardware or on a hardware already available in the device.

In some embodiments, after SoX is diagnosed and thus SoX values are determined SoX values, SoX parameters, state variables of the battery model, model parameters, measured battery parameters and simulated battery parameters are transferred to at least one of the following: battery management system, other device for regulating battery operation and device for storing battery data. This can be done with the aim to achieve at least one of the following: enhance battery control, prolong battery service life, improve battery safety, enhance battery performance, provide inputs for second life application of batteries, avoid unsafe operating conditions of batteries and mitigate operating conditions that might lead to faster rate of battery degradation.

In some aspects, the invention also relates to a data processing system comprising means for carrying out steps the method as described in this disclosure.

In some aspects, the invention also relates to a computer program or computer program product comprising instructions which, when executed by a computer, cause the computer to carry out steps of the method as described in this disclosure.

In some aspects, the invention also relates to a computer-readable storage medium comprising instructions which, when executed by a computer, cause the computer to carry out steps of the method as described in this disclosure.

In some aspects, the invention also relates to a computer-readable data carrier having stored thereon a computer program or computer program product comprising instructions which, when executed by a computer, cause the computer to carry out steps of the method as described in this disclosure.

In some aspects, the invention also relates to a data carrier signal carrying a computer program which comprises instructions which, when executed by a computer, cause the computer to carry out steps of the method as described in this disclosure.

BRIEF DESCRIPTION OF DRAWINGS

The FIG. 1 shows a flow diagram of an embodiment of a method in accordance with the present invention.

The FIG. 2 shows a non-restrictive block diagram of a device for carrying out a method in accordance with the present invention.

DETAILED DESCRIPTION

Figure 1:
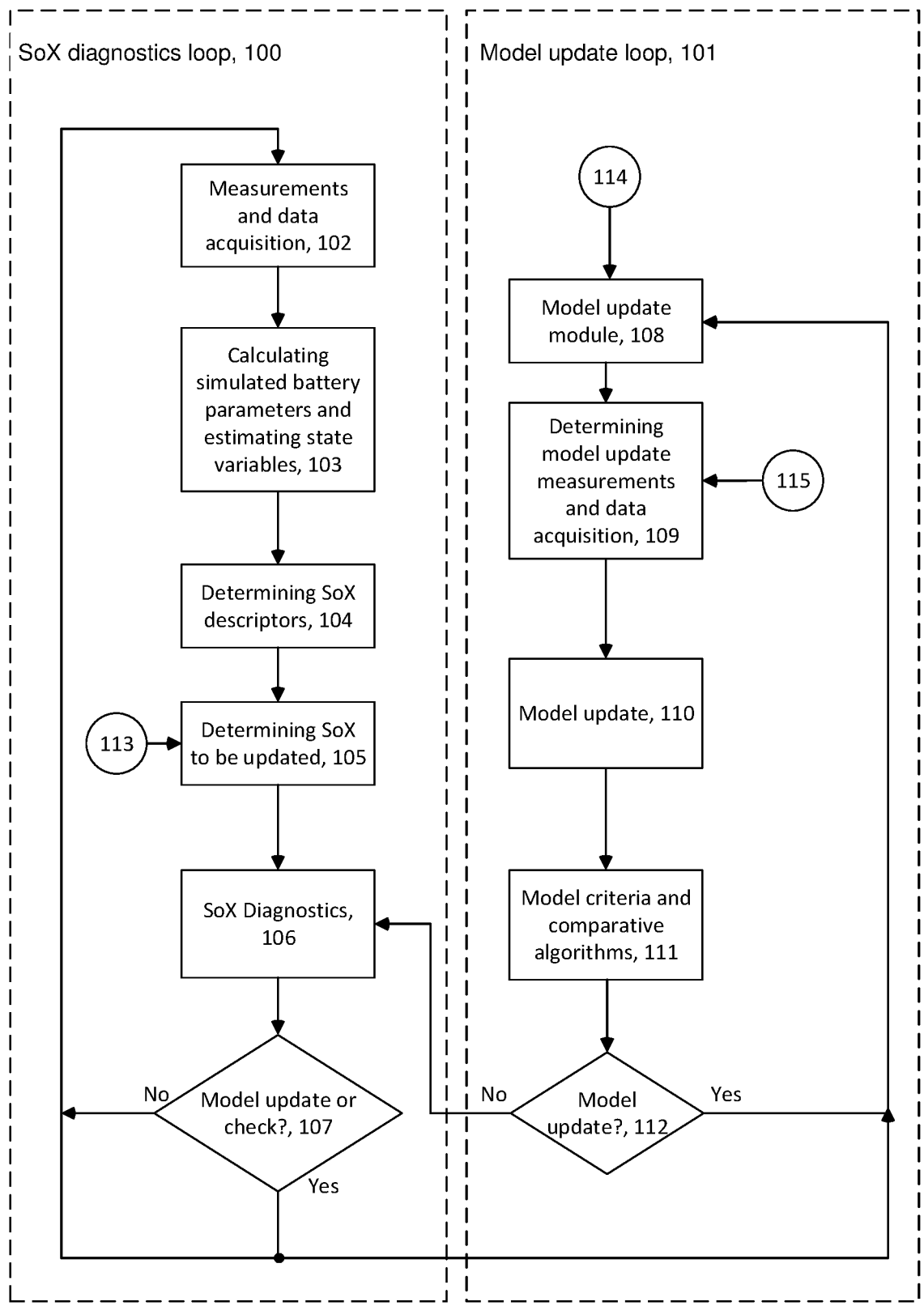

One or more specific embodiments will be described by way of example below. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

The key features of the present invention arise from its capability to diagnose SoX of insertion batteries using a combination of DC and/or AC input signals and processing them in a way to act on a single underlying physicochemically consistent battery model using identical model parameters. Such a model incorporates also non-linear effects and it is thus capable of modelling nonlinear characteristics of the cell in AC and DC domain, which is important for diagnostics during battery operation. Said feature is crucial to ensure wide range of SoX diagnosing functionalities and to increase feasibility of their execution in real application. This is related to the fact that certain parameters indicating specific SoX characteristics of batteries cannot be uniquely identified with only DC or only AC measurements, while, in addition, it is for example not always possible to perform DC measurements, whereas due to cost limitations execution of AC measurements and/or range and accuracy of AC measurements might be limited.

Presented invention comprises any physicochemically consistent battery model of the battery, which enables modelling and/or simulating and/or emulating a battery in a DC and AC domain. The model can be based on the so call electrochemical model (Newman & Tiedemann, AIChE Journal, 21.1: 25-41, 1975) and various types of their upgrades and extensions, which can, but need not, incorporate any combination of the following extensions and also any other extension, which enhances physicochemical consistency of the model: functionalities to model AC response of the battery, e.g. (Ong & Newman, Journal of The Electrochemical Society, 146.21:4360, 1999; Legrand et al., Journal of Power Sources, 251: 370-378, 2014), more detailed description of electrode topologies (Mele et al., Journal of The Electrochemical Society, 167.6: 060531, 2020), degradation effects (Forouzan et al., Journal of The Electrochemical Society 165.10: A2127, 2018; Jafari et. al, Journal of Energy Storage 20: 67-77, 2018; Katrašnik, Energy Conversion and Management 236: 114036, 2021), heat generation (Latz & Zausch, Journal of Power Sources 196.6: 3296-3302, 2011; Latz & Zausch, Beilstein journal of nanotechnology 6.1: 987-1007, 2015; Katrašnik, Energy Conversion and Management 236: 114036, 2021; Arunachalam & Onori, 2018 IEEE Conference on Decision and Control (CDC). IEEE, 2018), or with more detailed models of specific phenomena like for example redox reactions (Bai & Bazant, Nature communications 5.1: 1-7, 2014). In addition, physicochemically consistent battery models also comprise any physicochemically consistent equivalent circuit model, which is for example presented in the patent application (WO2022069699A1) or any other model that is based on governing equations that model, in a mechanistic manner, processes in insertion batteries and which rely on model parameters that are related to either intrinsic material properties and topological as well as geometric properties of batteries and their constitutive parts.

The content of WO2022069699A1 is incorporated herein in its entirety.

One of the nonrestrictive embodiments of the physicochemically consistent model is based on the widely applied porous electrode theory model (Newman & Tiedemann, AIChE Journal, 21.1: 25-41, 1975) comprising following governing equations:

$$\frac{\partial c_s}{\partial t} = \nabla(D_s \nabla c_s), \tag{1}$$

$$\nabla(\sigma^{eff} \nabla \phi_s) = -aFj^{TOT}, \tag{2}$$

$$\frac{\partial \varepsilon c_{ely}}{\partial t} = \nabla(D_{ely}^{eff} \nabla c_{ely}) + a(1 - t_+)j^{TOT}, \tag{3}$$

$$\nabla\left[\kappa_{ely}^{eff} \nabla \phi_{ely} - 2\frac{\kappa_{ely}^{eff} RT}{F}(1 - t_+)\left(1 + \frac{\partial \ln f_\pm}{\partial \ln c_{ely}}\right)\nabla \ln c_{ely}\right] = aFj^{TOT}, \tag{4}$$

and boundary conditions:

$$j^{TOT} = j^{BV} + j^{DL}, \tag{5}$$

-continued $$\tilde{C}_{DL}\frac{\partial(\phi_s - \phi_{ely})}{\partial t} = \frac{j^{DL}}{Fa}, \quad (6)$$

$$j^{BV} = \frac{j_0}{F}\left[\exp\left(-\frac{F\alpha}{RT}\eta\right) - \exp\left(\frac{F(1-\alpha)}{RT}\eta\right)\right], \quad (7)$$

$$\eta = -(\phi_S - \phi_{ely} - \tilde{U}_{OCV}), \quad (8)$$

$$\tilde{U}_{OCV} = U_{OCV} - \frac{\mu(c_s^0)}{F}, \quad (9)$$

$$\nabla c_s|_{z=L_p/2} = 0, \quad (10)$$

$$-D_s\nabla c_s|_{z=0} = j^{TOT}. \quad (11)$$

Quantities use the equations are explained in Table 1.

One of the nonrestrictive embodiments of physicochemically consistent equivalent circuit model can be obtained by obtained by transforming system of the equations 1-11 from partial differential equations to the algebraic equation, by introduction of following relations (Zelič et al., Journal of The Electrochemical Society 168.7: 070543, 2021; WO2022069699A1):

Divergence theorem $$\int_{\Delta V}\nabla(\nabla\psi)dV = \oint_{\partial V}\nabla\psi dA. \quad (12)$$

Electric charge and electric current definitions $$\varepsilon F\Delta x A c_{ely}^i = q^i, \quad (13)$$

$$\Delta x A a F j_{TOT}^i = I_{TOT}^i. \quad (14)$$

Nernst-Einstein relation in porous media $$D_{ely}^{eff} = \frac{2RT}{F^2 c_{ely}}\left(1 + \frac{\partial \ln f_\pm}{\partial \ln c_{ely}}\right)t_+(1-t_+)\kappa_{ely}^{eff}. \quad (15)$$

Definition of finite volume differences $$\nabla g^{i+1/2} \approx \frac{g^{i+1} - g^i}{\Delta x}. \quad (16)$$

Definition of capacitance $$q^i = C^i U_q^i. \quad (17)$$

Definition of voltage drop $$\phi^{i+1} - \phi^i = U_\phi^{i+1/2}. \quad (18)$$

Capacitor equation $$C^i\frac{\partial U_q^i}{\partial t} = I_q^i. \quad (19)$$

Ohm's law $$U_\phi^{i+1/2} = R_\phi I_\phi^{i+1/2}. \quad (20)$$

Introduction of Equations 12-20 into the equation system 1-11 gives the recursive algebraic equations:

$$I_{q,ely}^i - \frac{A\kappa_{ely}^{eff}t_+ + R_{\phi,ely1}}{\Delta x}(I_{\phi,ely1}^{i+1/2} - I_{\phi,ely1}^{i-1/2}) = I_{TOT}^i, \quad (21)$$

$$-I_{q,ely}^i + R_{\phi,ely1}\left(\frac{A\kappa_{ely}^{eff}(1-t_+)}{\Delta x} - \frac{D_{ely}^{eff}C_{ely}^i}{\varepsilon t_+\Delta x^2}\right)(I_{\phi,ely1}^{i+1/2} - I_{\phi,ely1}^{i-1/2}) - \quad (22)$$

$$\frac{D_{ely}^{eff}C_{ely}^i R_{\phi,ely2}}{\varepsilon t_+\Delta x^2}(I_{\phi,ely2}^{i+1/2} - I_{\phi,ely2}^{i-1/2}) = 0,$$

$$\frac{A\sigma^{eff}R_{\phi,s1}}{\Delta x}(I_{\phi,s1}^{i+1/2} - I_{\phi,s1}^{i-1/2}) = -I_{TOT}^i. \quad (23)$$

$$I_{q,s}^j = \frac{D_s C_s^j R_{\phi,s2}}{\Delta z^2}(I_{\phi,s2}^{j+1/2} - I_{\phi,s2}^{j-1/2}) \quad (24)$$

These recursive relations written in equations 21-24 can be interpret as Kirchhoff laws of electric circuit with that consist of capacitors and resistors with the values derived from equations 21-24 that read $$R_{\phi,s1} = \frac{L}{nA\sigma^{eff}}, \quad (25)$$

$$R_{\phi,ely1} = \frac{L}{nA\kappa_{ely}^{eff}t_+}, \quad (26)$$

$$C_{ely}^i = \frac{AL\varepsilon\kappa_{ely}^{eff}(1-t_+)t_+}{nD_{ely}^{eff}}, \quad (27)$$

$$R_{\phi,ely2} = \frac{L}{nA\kappa_{ely}^{eff}(1-t_+)}, \quad (28)$$

$$C_s R_{\phi,s2} = \frac{L_p^2}{m^2 D_s}. \quad (29)$$

Mapping presented in equations 25-29 is a key part that ensures physicochemically consistency of the equivalent circuit model, as they interrelate model parameters of an equivalent circuit model, i.e. resistances and capacitances, to intrinsic material properties and topological as well as geometric properties of batteries and their constitutive parts. Topological representations of this type of equivalent circuit models, which corresponds to the equations 21-24 and which is equivalent circuit elements defined by equations 25-29 can be found in (WO2022069699A1).

Since parameters of the physicochemically consistent models can be analytically derived from, or can be associated with, parameters that are related to material and topological as well as geometrical characteristics of the battery cells, physicochemically consistent models form an adequate basis for advanced SoX diagnostics. Therefore, proposed invention relating to a a computer-implemented method for diagnosing SoC, SoH, SoE, SoP, SoF and SoS incorporates methods for estimating state variables of the model and identifying model parameters using battery parameters measured in the DC and AC domain. This forms the basis for establishing causal chain of interactions between changes of a battery state variables or model parameters which pinpoint one or more specific degradation mechanisms, and thus SoX diagnosing. Proposed physicochemically consistent model can thus be used to: 1) determine or estimate battery state variables that cannot be directly measured by present sensors in real applications, 2.) determine parameters that can be interrelated with SoC, SoE, SoP and SoF, SoH and SoS, which includes multitude of non-interlaced or interlaced parameters that directly or indirectly influence SoC, SoE, SoP, SoF, SoH and SoS. Said a computer-implemented method can be part of BMS and/or a DT and/or a remote, e.g. cloud based, service and/or any other product and/or application and/or service to enable better battery control and/or prolong battery service life and/or improve battery safety and/or enhance its performance and/or provide inputs for second life application of batteries.

Within the context of this application the following terms are defined. A state variable denotes any variable that is used to describe any state of the battery, e.g. electrode potentials, temporary resolved lithiation level of electrodes or even temporary and spatially resolved lithiation level of electrodes, thickness or volume or mass of the SEI film, thickness or volume or mass of plated lithium and others. A model parameter denotes any variable that is used to describe intrinsic material properties and topological as well as geometric properties of batteries and any rates of reactions. A battery parameter denotes any variable that is measured by any of the sensors, which can include any kind of sensor that is applied outside or inside of the battery cell, or any parameter that is calculated by the model. If such battery parameters obtained through sensors and, if needed, through processing of these measured battery parameters, by e.g. filtering, it is denoted as measured battery parameters, while if the value of such a battery parameters is obtained by the simulation model it is denoted as simulated battery parameter.

SoX parameter denotes any parameter, which is used to diagnose any of the SoX (e.g. SoC, SoE, SoP and SoF, SoH and SoS), which comprise any measured battery parameter, simulated battery parameter, state variable and model parameter including parameters that are aggregated from these parameters as for example the internal resistance of the cell. SoX descriptors denotes at least one of the following variables or any weighted combination thereof:
   comparing value of at least one SoX parameter including stored previous values of SoX parameters to a threshold value specific for this parameter,
   comparing difference between at least one measured battery parameter and at least one simulated battery parameter to a threshold value specific for this parameter,
   comparing difference between two of more values of at least one SoX parameter determined at different time sequences to a threshold value specific for this parameter or state variable. Multiple SoX descriptors can be determined from SoX parameters. A particular SoX descriptor can be used to determine more than one SoX values. Any of the SoX values can be expressed in nondimensional or dimensional form as a constrained or unconstrained value, where a simple nonrestrictive example of SoC value comprises its representation in the interval between 0% and 100%. SoX value is at least one value that is used to numerical evaluate any of the SoX. SoX diagnostics is a procedure for determining any of the SoX values (e.g. SoC, SoE, SoP and SoF, SoH and SoS) using a processing engine, which is configured to receive at least one SoX descriptor to determine at least one SoX value. Processing engine represents any algorithm that is executed on any programable hardware and which uses at least one of the following: SoX descriptor and SoX parameter and none or at least one of the following: mechanistically based methods, including physicochemically consistent battery model, machine learning methods, artificial intelligence and any combination of these methods as well as any type of optimization methods, to determine at least one SoX value.

As processes in batteries occur at different time and length scales, state variables do change with significantly different dynamics. Similarly, also model parameters vary with significantly different dynamics, however, except in very specific and severe cases, state variables as for example lithiation levels and potentials change significantly faster compared to model parameters. Knowledge of variation of state variables and model parameters can, therefore, on one hand be used to minimize the effort of their estimation and identification, whereas on the other hand, their abnormal variation, which is very important in the light of SoX diagnostics, can indicate specific abnormal battery processes. Abnormal variation of specific state variables or model parameters, which are applied in SoX descriptors, are key inputs to perform model update by triggering specific model update measurements and/or managing battery operation in a way to avoid unsafe operating conditions of batteries and to mitigate operating conditions that might lead to faster rate of battery degradation.

Therefore, decision making algorithms that decide, which SoX needs to be updated is an instrumental part of the SoX diagnostics in real applications. It is namely from the cost and resources perspective unreasonable to continuously perform determination of all SoX parameters and diagnostics of all SoX. This is important also due to the fact, as it is from the cost and resources perspective unreasonable to continuously perform determination of all SoX parameters and diagnostics of all SoX, SoX diagnostics loop may incorporate one or more decision making algorithms that decide, which SoX needs to be updated. In a non-restrictive and simple example this can be interpreted that if no current is flowing thorough the battery, if battery is in a normal temperature range, if previous diagnostics did not reveal any potential critical state of the battery, if no sudden load increase of the battery is expected, it is not necessarily needed to perform determination one or more of the following values: SoP, SoF and SoS. A decision-making module configured to determine which SoX value needs to be updated, uses one of more inputs: SoX descriptors; processing engine comprising at least one of the following: mechanistically based methods, including physicochemically consistent battery model, machine learning methods, artificial intelligence and any combination of these methods as well as any type of optimization methods; triggering from any battery control unit or control unit of the system, in which battery is integrated; predetermined SoX update sequence (e.g. predetermined update frequency); to determined which SoX value needs to be updated. SoX diagnostics loop is hence configured to determined value of at least one SoX, which means that a previous SoX value is redetermined to more adequately reflect actual state of the physical battery.

SoX diagnostics crucially relies on capability to accurately estimate SoX parameters. Therefore, use of physicochemically consistent models represents a key to comply with this objective, since they preserve consistency between actual processes in the physical battery and processes modelled by the physicochemically consistent model and thus its state variables and model parameters. This is made possible if model structure, model parameters and state variables and adequate, which is checked in the model update loop. This means that physicochemically consistent model plausibly represents transport, electrochemical, thermal and degradation phenomena. To comply with these objectives, it is crucial to use a single underlying physicochemically consistent model using identical model parameters when processing data measured in the DC and/or AC domain. With such an approach the difference in model parameters and state variables can be assigned to a particular process or potentially hazardous operating condition and thus to a particular deviation used to diagnose SoX.

To ensure that battery model preserves consistency between actual processes in the physical battery, in some embodiments, the SoX diagnosing loop provides parameters that are used as criteria to evaluate if model needs to be updated. These criteria can be composed of SoX parameters, SoX descriptors, SoX values and any combinator thereof. A simple, but non-restrictive example, example addresses inability to match measured and simulated voltage with reasonable SoC range, which can be used as a SoX descriptor, indicating that model parameters, e.g. open circuit potential, or even model structure, e.g. due to presence of the interfacial films, do not correspond adequately to the actual state of the battery. Hence, within the SoX diagnosing loop a need to update or check the battery model is determined based on model update criteria that are determined at least in accordance with one of the following: SoX parameters, SoX descriptors, SoX values, while additionally, pinpointed specific degradation mechanism, identified inappropriateness of model parameters or identified inappropriateness of the model structure can be used to update the model or to check the model, if it is still adequate to simulate the battery processes in envisaged operating conditions of the battery. In addition, it is possible to trigger model update of check through external triggers and inputs to model update strategy from, as for example any battery control unit or control unit of the system, in which battery is integrated, and predetermined model update sequence.

Therefore, in some embodiments, a method comprises model update module, which is configured to determine a model update strategy for updating the battery model, which is an instrumental part of the model update loop. The main goal of the model update loop is to generate a model that more accurately virtually replicates battery processes, e.g. performance, to enable better control and monitoring of the battery. As models might be complex, it is from the computational perspective not always necessary to carry out identification of all model parameters, estimation of all model states and investigation or all relevant model structures, as this would be very computationally demanding and as this would require a lot of data. Therefore, one of the instrumental parts of the model update strategy relates to as accurate as possible identification of model parameters, state variables of parts of the model structure that need to be updated. This method is configured to determine model update strategy using autonomous decision-making algorithm, which is configured to autonomously identify, which state variables and model parameters as well as model structure or any combination thereof need to be updated. The main goal of the model update loop is to generate a model that more accurately virtually replicates battery processes, e.g. performance, to enable better control and monitoring of the battery. As models might be complex, it is from the computational perspective not always necessary to carry out identification of all model parameters, estimation of all model states and investigation or all relevant model structures, as this would be very computationally demanding and as this would require a lot of data. Therefore, one of the instrumental parts of the model update strategy relates to as accurate as possible identification of model parameters, state variables of parts of the model structure that need to be updated.

Therefore, methods for: 1. evaluation of state variable estimation accuracy, 2. uniqueness of model parameter identification, and 3.) assessing appropriateness of the model structure, are crucial parts of the framework for adequate SoX diagnosis.

Numerous battery models, parameters identification and state estimation methods have been developed and proposed in the literature. These identification and estimation methods can be divided in three main categories: online, offline and analytical-numerical calculation methods. For presented invention the most appropriate are online identification and estimation methods that must guarantee the following characteristics (Piegari, Energies, 10(12), 2007, 2017):
- a computational feasibility that allows real-time execution;
- the ability to identify/estimate all parameters/states with only measurements obtained from the hardware connected to the battery;
- the capability of identifying/estimating all parameters/states based on the battery's normal operating conditions.

Evaluation of state variable estimation accuracy can be performed with the Fisher information matrix and Cramer-Rao bound analysis (Cramer, Mathematical methods of statistics, Vol. 9, Princeton university press (1999)). Uniqueness of model parameter identification can be performed by a broad variety of methods and for example (Park, Journal of The Electrochemical Society, 165.7, A1309, 2018; Lass & Volkwein, Computational Optimization and Applications, 62.1, 217-239, 2015, Xia et al., Applied energy 179: 426-436, 2016; Lin et al., Journal of The Electrochemical Society, 162 A1879, 2015), where frequently applied methods rely on aforementioned Fisher information matrix (Bellman & Astrom, Mathematical biosciences 7.3-4: 329-339, 1970).

After the model is updated in the model update loop and after described as well as comparative algorithms are executed (FIG. 1, 111), model conversions are performed the model is, in the model update loop, checked before such an updated model is given to the SoX diagnostics loop. There are plurality of checks that can be performed and their exact formulation will depend on specific application. In a simple and non-restrictive example, accuracy of the model can be checked by assessing its capability to virtually replicate measured data, while prediction capability of the model can be checked by assessing its capability to virtually replicate measured data that was not used in the model update procedure. In addition, it is possible to assess uniqueness of model parameter identification and observability of states. Moreover, computational fastness of the model can be assessed to check it plausibility to run on a dedicated hardware with envisaged update frequencies. Therefore, in some embodiments, determining model criteria and executing comparative algorithms is crucial to evaluate if model criteria are fulfilled and if updated model can be given to the SoX diagnostic loop.

If all application specific criteria are full filled, the model is, from the model update loop, given to the SoX diagnostics loop, wherein the SoX diagnostics loop uses the present battery model until the updated model is provided by the model update loop to the SoX diagnostics loop, wherein the updated model replaces the present battery model in the SoX diagnostics loop.

As all data to update the model might not be available in the databases (in the battery management system, cloud, digital twin . . . ) in might be necessary to execute additional measurements to adequately update the model. Therefore, it is, based on the requirements of the model update strategy and based on the available data, in the model update loop, decided whether no measurement or at least one measurement of at least one battery parameter is to be carried out within the model update loop.

In some embodiments, model update strategy, therefore, also determines special or tailored measurements and data acquisition that need to be performed to most efficiently update the model. This includes wide range of potential measurements that can be performed only on demand, using special or tailored excitation sequences, with an aim to optimize use of resources. Such measurements might comprise, but are not limited to, adapting AC measurements in terms of the shape of the signal, frequency range, amplitude and duration of the measurement procedure as well as its superimposition on any type of DC signal with an objective to extract most information and to enable execution of model update measurements during normal battery operation. Likewise, this might include updating DC measurements in terms of the duration of the measurement procedure with an objective to extract most information and to enable execution of model update measurements during normal battery operation. Capability to parametrize a single underlying physicochemically consistent model, using identical model parameters when processing data measured in the DC and/or AC domain, enables higher fidelity of state variable estimation or model parameter identification from measurements recorded in a wide range of operating conditions including extended nonlinear impedance characteristics of the cell.

Advanced SoH and, in particular, SoS diagnostics rely on pinpointing specific symptoms or degradation mechanism, which can be determined either by direct measurement and/or by processing measured parameters with a physicochemically consistent model and/or by combination of both approaches with an aim to either pinpoint specific degradation mechanism or to confirm result obtained with one method with another method. Following text comprises several non-restrictive examples of pinpointing specific symptoms or degradation mechanism.

Ref (Pastor-Fernandez et al., Journal of Power Sources, 360: 301-318, 2017) proposes a robust method to identify and quantify the effects of degradation mechanisms in Li-ion batteries using EIS and IC as well as DV methods. Ref. (Pastor-Fernandez et al., Journal of Power Sources, 360: 301-318, 2017) shows impact of SEI growth on the EIS spectra and thus changed resistivity might also be an indication for loss of lithium inventory, due to its incorporation into SEI. EIS, and in particular zero-intercept frequency, can also be used to estimate cell temperature (Raijmakers et al., IEEE Transactions on Industrial Electronics, 63.5: 3168-3178, 2016), whereas they report interference with battery storage capacity. In addition, also porosity variation can be pinpointed by the EIS spectra and, in particular, through the variation of phase angles (Kim et. al., Journal of Power Sources 510: 230338, 2021). It is also possible to identify Li-plating via EIS measurements from response of higher order harmonics (Harting et al., Electrochimica Acta 281: 378-385, 2018). Ref. (Murbach & Schwartz, Journal of The Electrochemical Society 164.11: E3311, 2017) proposes nonlinear electrochemical impedance spectroscopy bases analysis of kinetic, mass-transport, and thermodynamic parameters and show that the second harmonic is sensitive to the symmetry of the charge transfer reactions in the electrodes, whereas EIS is not. In addition, reference (Fasmin & Srinivasan, ournal of The Electrochemical Society, 164.7, H443, 2017) reports that, at low frequencies, nonlinear electrochemical impedance spectroscopy is capable of probing sensitivity to model parameters that are not accessible with EIS and thus using higher harmonics, it is possible to increase the number of physicochemical parameters that can be assessed in experiments. EIS can also be used to identify specific safety hazardous phenomena, as for example significant change of the phase shift before venting the battery (Srinivasan et al., Journal of The Electrochemical Society, 169:020522, 2022). Loss of lithium inventory and loss of active material can also be extracted from the IC and DV curves (Pastor-Fernandez et al., Journal of Power Sources, 360: 301-318, 2017). It is also possible to identify Li-plating from the voltage derivatives (Yang et al., Journal of Power Sources 395: 251-261, 2018).

EIS can be measured using microcontrollers, whereas some authors have proposed a low-cost impedance measurement system using the current signal of the DC converter to excite the battery across a wide range of frequencies (Pastor-Fernandez et al., Journal of Power Sources, 360: 301-318, 2017). For the IC-DV, the cells, in general, need to be discharged or charged at constant and low C-rate to ensure the battery is at equilibrium, where C/10 is applied in ref. (Pastor-Fernandez et al., Journal of Power Sources, 360: 301-318, 2017). This might be difficult to realize in real-driving scenarios and therefore the IC-DV technique could be only applied on-board when the battery is charged slowly at low and constant C-rate (Pastor-Fernandez et al., Journal of Power Sources, 360: 301-318, 2017). Such tests also do not need to be performed very frequently, as degradation processes are in normal health state of battery and normal operating conditions relatively slow, and thus it is in practice feasible to schedule them. Ref. (Pastor-Fernandez et al., Journal of Power Sources, 360: 301-318, 2017) indicates two tests per year, whereas to ensure high level of safety present invention includes an algorithm to trigger measurement of battery parameters at adequate sequences. In addition, application of the physicochemically consistent model makes possible higher fidelity of simulated results in wide range of operating conditions of the battery and also higher fidelity of state variable estimation or model parameter identification from measurements recorded in a wide range of operating conditions and thus application of physicochemically consistent model broadens the range of operating conditions of the battery that yield measured data suitable for IC-DV.

It is well known that EIS measurements are performed at a particular SoC (or during dynamic measurement in a very limited SoC window), while data for deriving IC-DV curves are recorded along the whole SoC window. Therefore, unlike IC-DV method, EIS enables pinpointing the effects of the degradation mechanisms at a particular SoC. However, it might be challenging to perform EIS measurements during battery cycling, as measurement at low frequencies might be subjected to significant SoC variation, while larger signals might excite the nonlinear impedance characteristics of the cell.

It is also well known that it is possible to determine certain model parameters (e.g. electrode thickness, size of active particles, intrinsic material properties and others) by directly measuring them after the cell is disassembled. In addition, several techniques (e.g. X-ray and neutron imaging and others) that can be applied on the assembled cell provide insightful information on the level of lithiation, delamination and other phenomena but they can, in general, not be applied when monitoring real devices in real environment. However, despite this fact, parameters obtained from the detailed experimental techniques, that are, in general, not applicable to monitoring real devices in real environment and techniques applied to disassembled cells, can provide a very valuable input for performing SoX diagnosis. This can be realized, but is not limited to, by the procedure to characterize fresh and degraded cell in a laboratory environment and to store data, which is used in algorithms for estimation of state variables, triggering parameter identification procedure, procedure for triggering of measurement of battery parameters, parameter identification procedure and SoX diagnostics procedure, to the Database.

Physicochemically based model are advantageous to act as virtual sensors of state variables determine or estimate internal battery state variables that cannot be directly measured by present sensors in real applications, as for example electrode potentials, temporary resolved lithiation level of electrodes or even temporary and spatially resolved lithiation level of electrodes and others. Exemplarily, anode potential, in particular for anode material that feature low potential with respect to $Li/Li^+$, is in combination temperature of the cell and charging current a very important parameter to prevent Li-plating (Wurzenberger et al., SAE Technical Paper, 2022; Li et al., Journal of Power Sources 506: 230034, 2021). Whereas, if such operation cannot be avoided, it is a good parameter for pinpointing consequent degradation mechanism, which increases fidelity and accuracy of SoX diagnosis. Thereby, exemplarily, with support of physicochemically consistent models fast charging process can be managed in a battery health-conscious manner (Wurzenberger et al., SAE Technical Paper, 2022). In a similar manner, average lithium-ion concentration in both electrodes reflects roughly the average utilization of lithium-ions in the electrodes and can, but need not, provide direct input for SoC, SoE and SoF diagnosing, whereas it can, but need not, provide input also to SoH, SoP and SoS diagnosing. Likewise, surface concentration of lithium in active material and electrolyte concentration most directly impact the SoP.

In addition, models, and in particular physicochemically based models, can be applied in model-based fault detection and isolation of sensors, as for example current, voltage and temperature sensor fault (Liu et al., Control engineering practice 52: 46-58, 2016), which is very important for credible SoX diagnostics, as knowledge on the trustworthiness of data used in SoX diagnostics is very important. Holistic SoX diagnostics based on physicochemically based model of the present invention is also important due to the fact that measured values are, in general, subjected to measurement error, as for example current sensor is influenced by several issues, including environmental electromagnetic noise, temperature, limited bandwidth and others (Gong, Doctoral dissertation, 2016). In the case of the current sensor these errors will accumulate due to the integration operation can cause difficulties in estimating states.

A selected and non-restrictive example of model update strategy that triggers specific model update measurements can be illustrated as follows. When estimating SoC, it is possible to encounter discrepancies between measured cell voltage, and measured as well as modelled charge throughput, where a battery model, which uses parameters that were determined at a previous, or any preceding, time instance, is applied. With the information on this discrepancy, which indicates mismatch between estimated SoC and cell voltage, and with additional data that are already stored from previous SoX diagnoses, modelling update strategy can trigger different measurements, as there exists high likelihood that specific states of battery parameters or consequently model parameters have changed. For example, it can trigger specific model update measurements of the relevant frequency range in the EIS spectra, which is characteristic for pinpointing SEI and/or Li-plating. If, for example, also cell temperature is rising, it can trigger measurements in a specific range characteristic for pinpointing specific safety hazardous phenomena, as for example significant change of the phase shift before venting the battery (Srinivasan et al., Journal of The Electrochemical Society, 169:020522, 2022). The key feature of the modelling update strategy, which triggers specific model update measurements, is decision if additional measurements are need and which measurements are needed to most efficiently estimate state variables or identify model parameters or update model structure or, if possible, determine SoX parameters that enable diagnosing one or more of the SoX parameters. This procedure can be performed in several sequences if initial request for additional measures did not result in credible diagnosis, as with additional information it is possible to better pinpoint potential degradation or safety critical mechanisms and thus to trigger additional measurements with an aim to pinpoint degradation mechanisms, sensor error or other battery deteriorating effect of malfunction of extra-battery hardware. This process can be supported by mechanistic and/or artificial intelligence methods.

SoX diagnostics loop also considers different time scales and in particular severity levels of phenomena. This means that in specific operating conditions and, in particular, in specific safety critical operating conditions, measurements are performed and/or triggered in a way to ensure very fast and preferably real-time diagnostics. This includes also selection of adequate techniques and adequate application of these techniques, e.g. adequate frequency ranges of the EIS method, and adequate methods to process measurement data and to estimate state variable and/or to identify model parameters and to diagnose SoX in a sufficiently short time.

The present invention also relates to determining complex SoX parameters via the single underlying physicochemically consistent model and associated tools for state variable estimation and model parameter identification. One simplistic and non-restrictive, example is related to the example of SEI growth that cannot be directly measured by present sensors in real applications, however it is manifested in loss of cyclable lithium (influencing SoE, SoF and SoH), increased overpotential and thus lowering cell voltage at a particular SoC (influencing SoE, SoF and SoH), and resultantly in more heat generation. With the use of at least one of these measured battery parameters and application of the physicochemically consistent model and associated tools for state variable estimation and model parameter identification, it is possible to pinpoint potential SEI growth. If algorithms for estimating accuracy of state variable estimation and uniqueness of model parameter identification detect that this SEI growth should, due to any reason, not be determined with sufficient certainty, or if battery is in such a state or operating conditions that require more certain determination of SEI growth, or update or check of modelling setup or any battery control unit or control unit of the system, in which battery is integrated, can trigger specific model update measurements, as for example measuring relevant frequency range in the EIS spectra, which is characteristic for determining SEI. This process can be supported by mechanistic and/or artificial intelligence methods.

Efficient SoX diagnostics according to present invention, therefore, relies on adequate determination of SoX value with reasonable processing resources and memory resources (that require as few operations as needed and as many as feasible) and using reasonable amount of measured data, which might in this non-restrictive example cover data, which are currently stored in the memory and/or which are stored in the database, which can be measured continuously or based on an algorithm for triggering measurement of battery parameters. Therefore, method for diagnosing SoX of at least one battery comprises two loops: 1. SoX diagnostics loop (FIGS. 1, 100) and 2. model update loop (FIG. 1, 101). In addition, it is crucial to use a single underlying physicochemically consistent model using identical model parameters when processing data measured in the DC and/or AC domain. With such an approach the difference in model parameters and state variables can be assigned to a particular process or potentially hazardous operating condition and thus to a particular deviation used to diagnose SoX through determining SoX values.

In this respect the SoX diagnostics loop is configured to execute multiple steps. It is configured to receive, from at least one sensor, at least one measured battery parameter of the battery (FIG. 1, 102), and to calculate at least one simulated battery parameter (FIG. 1, 103) corresponding to the at least one measured battery parameter by using a given battery model. Afterwards at least one state variable of the battery model is calculated and/or estimated (FIG. 1, 103) using measured battery parameters and the given model and all relevant measured or simulated parameters form the present time instant or and preceding time instances. All these inputs are used to calculate SoX descriptors (FIG. 1, 104) denoting at least one of the following variables or any weighted combination thereof:

- comparing value of at least one SoX parameter including stored previous values of SoX parameters to a threshold value specific for this parameter, comparing difference between at least one measured battery parameter and at least one simulated battery parameter to a threshold value specific for this parameter,
- comparing difference between two of more values of at least one SoX parameter determined at different time sequences to a threshold value specific for this parameter or state variable.

Afterwards, it is determined which SoX need to updated (FIG. 1, 105), based on at least one of the following: SoX descriptor, processing engine, triggering from any battery control unit or control unit of the system, in which battery is integrated, and predetermined SoX update sequence (FIG. 1, 113), to avoid unnecessary cost and resources usage arising from unreasonable continuously determination of all SoX.

Afterwards, at least one SoX value is determined (FIG. 1, 106), in particular State-of-Charge (SoC), State-of-Health (SoH), State-of-Energy (SoE), State-of-Power (SoP), State-of-Function (SoF) and State-of-Safety (SoS), using at least one of the following: SoX descriptor and SoX parameter and none or at least one of the following: mechanistically based methods, including physicochemically consistent battery model, machine learning methods, artificial intelligence and any combination of these methods as well as any type of optimization methods and comparative algorithms. At least one of the following data: SoX value, state variables of the battery model, model parameters, measured battery parameters and simulated battery parameters, is then provided to the to a battery management, which is configured to manage the battery. This includes traditional BMSs and any other types of distributed systems that interact with BMS or systems that exchange signals with the battery, e.g. any remote and cloud based solutions including digital twins. The battery management can, for example based on these data, mitigate the impact of extrinsic factors on battery pack degradation. Some strategies could be for example limiting battery current, limiting battery current in specific temperature conditions, reducing the allowable depth-of-discharge of the battery or adaptively managing changing the charging strategy, managing the thermoregulation system in a way to enable adequate battery operation, balancing cells and/or operating different cells or modules in a different manner according to the information on SoX.

SoX diagnosing loop provides parameters that are used as inputs to evaluate if model needs to be updated (FIG. 1, 107). Consequently, based on at least one of the following: the at least one SoX parameter, the at least one SoX descriptor and the at least one SoX value, it is determined whether an update is to be carried out on the model. In addition, it is possible to trigger model update of check through external triggers and inputs to model update strategy from, as for example any battery control unit or control unit of the system, in which battery is integrated, and predetermined model update sequence. In response to determining that the update is to be carried out, the battery model is updated by the model update loop (FIG. 1, 101).

A model update loop (FIG. 1, 101) comprises a model update strategy (FIG. 1, 108), which is an instrumental part of the model update loop. This method is configured to determine model update strategy using autonomous decision-making algorithm, which is configured to autonomously identify, which state variables and model parameters as well as model structure or any combination thereof need to be updated. This autonomous decision-making algorithm using at least one of the following: measured battery parameter, simulated battery parameter, state variable, model parameter, i.e. SoX parameters, and, SoX descriptors and SoX values; processing engine comprising at least one of the following: mechanistically or physics based methods, for example physicochemically consistent battery model, machine learning methods, artificial intelligence and any combination of these methods as well as any type of optimization methods. It is also possible to determine model update strategy using external triggers and inputs to model update strategy from: any battery control unit or control unit of the system, in which battery is integrated; and predetermined model update sequence, which can in an illustrative non-restrictive example comprise a predetermined update frequency (FIG. 1, 114). The main goal of the model update loop is to generate a model that more accurately virtually replicates battery processes, e.g. performance, to enable better control and monitoring of the battery. As models might be complex, it is from the computational perspective not always necessary to carry out identification of all model parameters, estimation of all model states and investigation or all relevant model structures, as this would be very computationally demanding and as this would require a lot of data. Therefore, one of the instrumental parts of the model update strategy relates to as accurate as possible identification of model parameters, state variables of parts of the model structure that need to be updated.

As all data to update the model might not be available in the databases (in the battery management system, cloud, digital twin . . . ) in might be necessary to execute additional measurements to adequately update the model. Therefore, it is, based on the requirements of the model update strategy and based on the available data, in the model update loop, decided whether no measurement or at least one measurement of at least one battery parameter is to be carried out within the model update loop.

In some embodiments, model update strategy, therefore, also determines special or tailored measurements and data acquisition that need to be performed to most efficiently update the model (FIG. 1, 109). This includes wide range of potential measurements that can be performed only on demand, using special or tailored excitation sequences, with an aim to optimize use of resources. Such measurements might comprise, but are not limited to, adapting AC measurements in terms of the shape of the signal, frequency range, amplitude and duration of the measurement procedure as well as its superimposition on any type of DC signal with an objective to extract most information and to enable execution of model update measurements during normal battery operation. Likewise, this might include updating DC measurements in terms of the duration of the measurement procedure with an objective to extract most information and to enable execution of model update measurements during normal battery operation. Determination whether no measurement or at least one measurement of at least one battery parameter is to be carried out within the model update loop is carried out using at least one of the following:

availability of data stored in the any of the databases available to the device, which is configured to execute the claimed method, the at least one SoX parameter, the at least one SoX descriptor, or the at least one SoX value, a processing engine incorporated in or accessible by the SoX diagnostics loop, wherein the processing engine comprising at least one of the following: mechanistically or physically based models, for example a physicochemically based battery model, machine learning methods, artificial intelligence or any combination of these as well as any type of optimization methods, external triggers and inputs to the model update module from any battery control unit or control unit of the system, in which battery is integrated (FIG. 1, 115).

Following the model update strategy and using measured data, either from the database or from newly conducted measurements, the model update loop is configured to perform at least one of the following model update (FIG. 1, 110) tasks: identification of model parameters, estimation of state variables, a battery model structure update. These tasks are executed in the model update module, which is configured to update the battery model according to the model update strategy, wherein the model update strategy is executed using, for example, the battery model and optimization methods, or machine learning, or artificial intelligence or any combination thereof to identify model parameters, estimate state variables, update battery model structure according to the model update strategy, where all or only some of these tasks are carried out in accordance with the model update strategy. Model update strategy is determined using at least one of the following: the at least one SoX parameter, the at least one SoX descriptor, or the at least one SoX value; a processing engine incorporated in or accessible by the SoX diagnostics loop, wherein the processing engine comprising at least one of the following: mechanistically or physically based models, for example a physicochemically based battery model, machine learning methods, artificial intelligence or any combination of these as well as any type of optimization methods. In addition, this procedure can use also parameters from a battery control unit or a control unit of the system, in which battery is integrated or a combination of listed inputs.

In some embodiments, the method is configured to carry out a battery model structure setup with battery model parameter identification and model conversion on at least one of the following: local hardware with appropriate data support, and adequate artificial intelligence methods for complex nonlinear battery modelling, and remote processing backend where optimization methods and machine learning algorithms procedures are carried out.

In some embodiments, this procedure is supported by the model selection procedure, which comprises at least one of the following:

performing the automatic conversion of an identified non-linear electrochemical battery model into a family of substitutions linearized battery models using different methods including but not limited to balanced realisation, automatically verifying the specific properties of substitutions models such as model controllability, observability, using their respective Gramians, frequency characteristic, and stability, using mathematical metrics, for example Hinf, H2, Linf and LQG, for comparative criteria when selecting the optimal substitution battery model, automatically calculating or determining one or more associated observers for the selected model according to the needs of SoX calculations for the battery.

After the model is updated in the model update loop and after described model conversions are performed as well as comparative algorithms are executed (FIG. 1, 111), the model is, in the model update loop, checked (FIG. 1, 112) before such an updated model is given to the SoX diagnostics loop. Therefore, in some embodiments, determining model criteria and executing comparative algorithms is crucial to evaluate if model criteria are fulfilled and if updated model can be given to the SoX diagnostic loop.

If all application specific criteria are full filled (FIG. 1, 112), the model is, from the model update loop, given to the SoX diagnostics loop, wherein the SoX diagnostics loop uses the present battery model until the updated model is provided by the model update loop to the SoX diagnostics loop, wherein the updated model replaces the present battery model in the SoX diagnostics loop.

Figure 2:
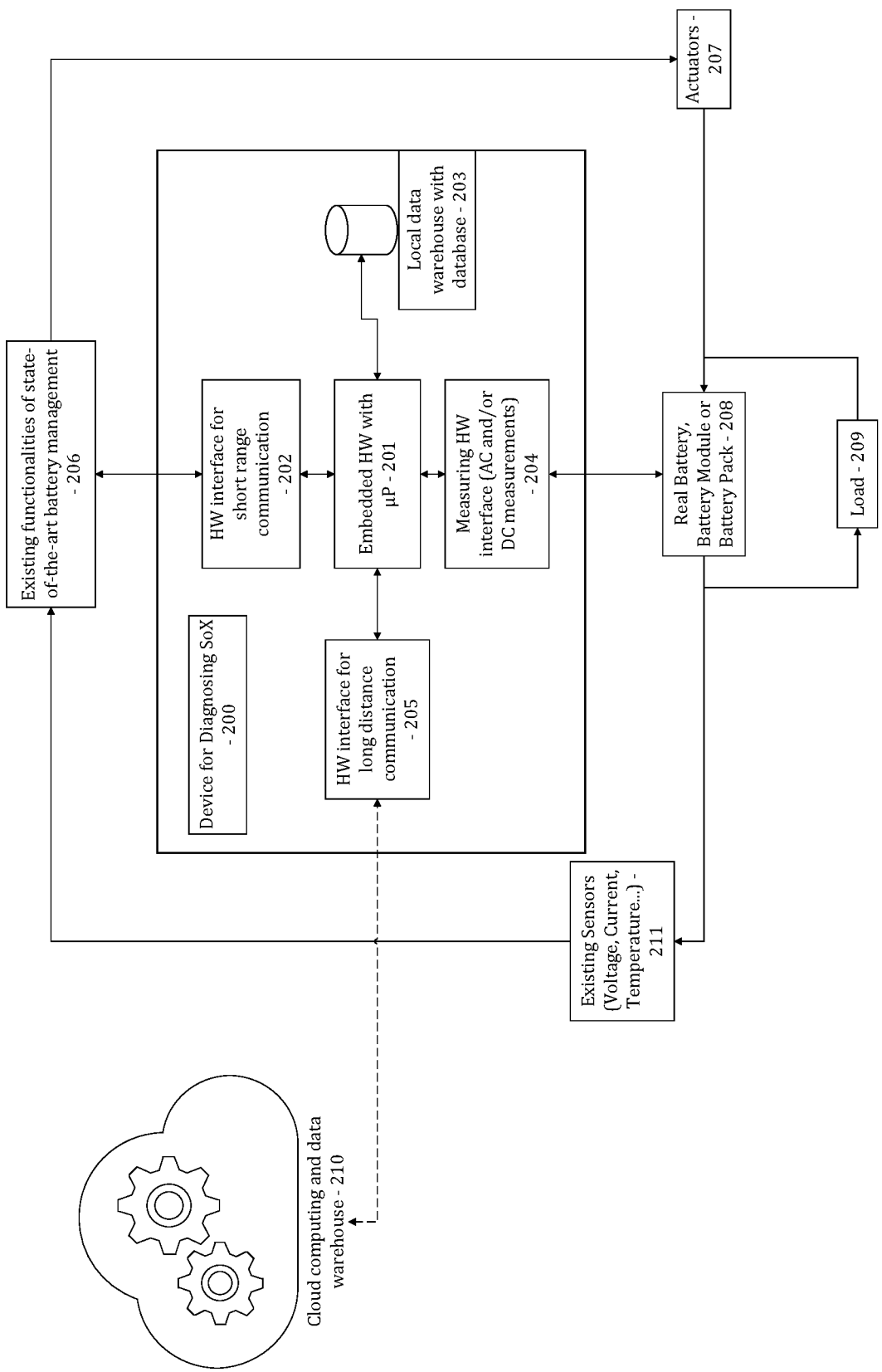

In a non-restrictive example, the method of diagnosing a SoX can be carried out on a device for diagnosing SoX (FIG. 2, 200), which consists of an embedded computer with at least one microprocessor (FIG. 2, 201), which can be standard or strictly dedicated HW, and is connected to a local data warehouse (FIG. 2, 203), a hardware measuring interface (FIG. 2, 204), a hardware communication interface for long-distance wireless communication (FIG. 2, 205), and a hardware communication interface for wired and wireless communication with nearby devices (FIG. 2, 202). The method of diagnosing a SoX can be carried out on a single physically integrated hardware, which can be part of the battery management and which means that 201 and 206 in FIG. 2 share the same HW, or on more distributed hardware systems, where e.g. 201 and 206 in FIG. 2 represent different HW using communication interface (FIG. 2, 202), and systems including remote, e.g. cloud services (FIG. 2, 210) communicating via the hardware communication interface for long-distance wireless communication (FIG. 2, 205). Similar is valid for data storage, where all data is being stored on at least one of the following: a single physically integrated hardware, one or more distributed hardware systems (FIG. 2, 203 and FIG. 2, 210) and systems including remote, e.g. cloud services (FIG. 2, 210). The method of diagnosing a SoX can also acquire measured data of a real battery, battery module or battery pack (FIG. 2, 208) that is connected to any load (FIG. 2, 209) and actuators (FIG. 2, 207) via existing sensors (FIG. 2, 204), whereas it is also possible that measured data, in particular special or tailored measurements that need to be performed to most efficiently update the model (FIG. 1, 109), are acquired via a the hardware measuring interface (FIG. 2, 204).

Analyses that are performed in the development phase of the device for SoX diagnostics also ensure to pinpoint most relevant sensors, processing units, memory requirements of a single or distributes systems, exchange and update frequencies and other relevant parameters that make possible selection of adequate hardware components to ensure proper SoX diagnostics at acceptable costs.

Table 1 (List of Symbols)

Symbol Meaning [units]
A Cross-section surface area of the electrode [$m^2$]
a volumetric density of electrode active material surface [1/m]
α charge transfer coefficient
$C^i$ Capacitance of control volume
$C_{DL}$ Double layer capacitance of each control volume [F]
$\tilde{C}_{DL}$ Double layer capacitance per surface area in porous electrode [F]
$C_{ely}{}^i$ Electrolyte chemical capacity of control volume [F]
$c_{ely}$ Molar concentration in ions in electrolyte [$mol/m^3$]
$c_{ely}{}^i$ Average molar concentration of ions in electrolyte in control volume [$mol/m^3$]
$C_{q,s}$ Active material chemical capacity of control volume [F]
$\tilde{C}_{q,s}$ Volumetric active material chemical capacity of control volume [F]
$D_{ely}$ Chemical diffusion coefficient of ions in electrolyte [$m/s^2$]
$D_{ely}{}^{eff}$ Effective diffusion coefficient of ions in electrolyte [$m/s^2$]
$\Delta V_i$ $i^{th}$ Control volume [$m^3$]
$\Delta V$ Control volume [$m^3$]
$\partial V$ Surface area of control volume [$m^2$]
$\Delta x_i$ Length of $i^{th}$ control volume [m]
ε Electrode porosity (fraction of electrolyte in electrode) [–]
F Faraday constant As/mol
$f_\pm$ Activity coefficient in electrolyte
$\phi^i$ Average electric potential in $i^{th}$ control volume [V]
$\phi_{ely}$ Electrolyte potential [V]
$\phi_s$ Solid potential [V]
$i_0$ Butler-Volmer exchange current density [$A/m^2$]
$i_{APP}$ Applied current density [$A/m^2$]
$I_\phi{}^{i+1/2}$ Electric current across control volume boundary [A]
$I_{\phi,ely1}{}^{i+1/2}$ Electric current across control volume boundary carried by anions [A]
$I_{\phi,ely2}{}^{i+1/2}$ Electric current across control volume boundary carried by cations [A]
$I_{\phi,s}{}^{i+1/2}$ Electric current across control volume boundary carried by electrons [A]
$I_q{}^i$ electric current across control volume [A]
$I_{q,ely}{}^i$ Ionic current in electrolyte across control volume [A]
$I_{BV}{}^i$ Average Butler-Volmer current in control volume [A]
$I_{DL}{}^i$ Average current in/out of double layer in control volume [A]
$I_{TOT}{}^i$ Average current from the solid to liquid phase in control volume [A]
$j_{BV}$ Molar flux due to the reaction at the active material surface [$mol/m^2s$]
$j_{DL}$ Molar flux in/out of double layer [$mol/m^2s$]
$j_{TOT}$ Total molar flux of charged species from the solid to liquid phase [$mol/m^2s$]
$j_{TOT}{}^i$ Average total molar flux in control volume [$mol/m^2s$]
$\kappa_{ely}$ Ionic conductivity of electrolyte [1/Ωm]
$\kappa_{ely}{}^{eff}$ Effective ionic conductivity of electrolyte [1/Ωm]
L Electrode thickness
n Discretization number (number of electrode slices) [–]
ψ Arbitrary scalar field
$q^i$ Quantity of charge inside control volume [$As/m^3$]
R Gas constant [J/molK]
$R_{ap}$ Active particle radius [m]
$R_\phi$ Resistance of control volume boundary
$R_{\phi,s}$ Control volume boundary resistance for electrons in conductive solid [Ω]
$R_{\phi,ely1}$ Control volume boundary resistance for anions in electrolyte [Ω]
$R_{\phi,ely2}$ Control volume boundary resistance for cations in electrolyte [Ω]
$R_s$ Control volume boundary resistance for anions in active material [Ω]
σ Electron conductivity of conductive solid [1/Ωm]
$\sigma^{eff}$ Effective electron conductivity of conductive solid [1/Ωm]
T Temperature [K]
t Time [s]
$t_+$ Transport number in electrolyte [–]
$U_0$ Electrode active material redox potential [V]
$U_{APP}$ Applied voltage [V]
$U_{BV}{}^i$ Average overpotential inside control volume [V]
$U_{DL}{}^i$ Average double layer voltage inside control volume [V]
$U_q{}^i$ Voltage on the chemical capacitor in control volume [V]
$U_\phi{}^{i+1/2}$ Voltage drop across control volume interface [V]
z Number of electrons involved in the reaction [–]

The invention claimed is:

1. A computer-implemented method of diagnosing one or more SoXs selected from the group consisting of State-of-Charge (SoC), State-of-Health (SoH), State-of-Energy (SoE), State-of-Power (SoP), State-of-Function (SoF) and State-of-Safety (SoS), of at least one battery, the method comprising:
    executing a SoX diagnostics loop, based on a given battery model, the executing of the SoX diagnostic loop including
    receiving, by the SoX diagnostics loop from at least one sensor, at least one measured battery parameter of the battery,
    determining, by the SoX diagnostics loop, at least one SoX descriptor of the battery using at least one of the following: at least one SoX parameter, at least one comparison of the at least one SoX parameter: to its previous value, to the at least one another SoX parameter, to at least one threshold value, wherein the at least one SoX parameter is one of the following: the at least one measured battery parameter, at least one simulated battery parameter provided by the battery model, at least one state variable or at least one model parameter of the battery model,
    determining, by the SoX diagnostics loop, at least one SoX value associated with the SoX in dependence on at least one of the following: the at least one SoX descriptor and the at least one SoX parameter,
    determining, by the SoX diagnostics loop, whether an update is to be carried out on the model using a criterion to evaluate if the model needs to be updated, wherein the criterion is based on at least one of the following: the at least one SoX parameter, the at least one SoX descriptor and the at least one SoX value; and entering and executing a model update loop, which is configured to update the battery model and which is entered only in response to the SoX diagnostic loop determining that the battery model must be updated, the executing of the model update loop including:

executing an autonomous decision-making algorithm to autonomously identify which of state variables, model parameters, model structure, and combinations thereof of the battery model are to be updated, updating the battery model as identified by the autonomous decision-making algorithm, providing, by the model update loop, the updated battery model to the SoX diagnostics loop, wherein the updated model replaces the given battery model in the SoX diagnostics loop, and reentering the SoX diagnostic loop.

2. The method of claim 1, wherein the SoX diagnostics loop is configured to carry out at least one of the following steps:

calculating the at least one simulated battery parameter corresponding to the at least one measured battery parameter by using the given battery model, determining the at least one state variable using the battery model, calculating at least one SoX descriptor of the battery.

3. The method of claim 1, wherein a decision-making module is configured to determine which SoX value of the battery from one or more predetermined SoXs shall be updated, wherein the SoX value that shall be updated is determined based on at least one of the following:

the at least one SoX descriptor, a processing engine incorporated in or accessible by the SoX diagnostics loop, wherein the processing engine comprises at least one of the following: mechanistically or physically based models, for example a physicochemically based battery model, machine learning methods, artificial intelligence or any combination of these as well as any type of optimization methods, a trigger provided from the outside, in particular by a battery control unit used to control the battery or a control unit of a system, into which the battery is integrated, a trigger provided in the SoX diagnostics loop.

4. The method of claim 1, where at least one SoX value is determined based on at least one of the following:

the at least one SoX parameter and the at least one SoX descriptor, values of previous SoX values, at least one parameter from the battery control unit or control unit of the system, in which the battery is integrated.

5. The method of claim 1, wherein the method further includes:

carrying out, by the SoX diagnostics loop, none or at least one of the following: estimating one or more state variables, pinpointing at least one specific degradation mechanism of the battery, identifying inappropriateness of at least one model parameter and identifying inappropriateness of the model structure.

6. The method of claim 1, wherein the module update loop comprises a model update module, which is configured to determine a model update strategy for updating the battery model based on at least one of the following:

the at least one SoX parameter, the at least one SoX descriptor, or the at least one SoX value, a processing engine incorporated in or accessible by the SoX diagnostics loop, wherein the processing engine comprising at least one of the following: mechanistically or physically based models, for example a physicochemically based battery model, machine learning methods, artificial intelligence or any combination of these as well as any type of optimization methods, external triggers and inputs to the model update module from any battery control unit or control unit of the system, in which battery is integrated, a predetermined update sequence;

and to identify at least one of the following: model parameters, state variables and the model structure, that need to be updated.

7. The method of claim 1, wherein updating the battery model comprises determining, by the module update loop, whether no measurement or at least one measurement of at least one battery parameter is to be carried out, within the model update loop, using at least one of the following:

availability of data stored in at least one databases provided to or accessible by the model update loop, the at least one SoX parameter, the at least one SoX descriptor, or the at least one SoX value, a processing engine incorporated in or accessible by the SoX diagnostics loop, wherein the processing engine comprising at least one of the following: mechanistically or physically based models, for example a physicochemically based battery model, machine learning methods, artificial intelligence or any combination of these as well as any type of optimization methods, external triggers and inputs to the model update module from any battery control unit or control unit of the system, in which battery is integrated.

8. The method of claim 1, wherein the model update loop is configured to carry out at least one of the following steps:

performing at least one of the following model update tasks: identification of model parameters, estimation of state variables, a battery model structure update, determining model criteria and executing comparative algorithms.

9. The method of claim 1, wherein the module update loop comprises a model update module, which is configured to update the battery model according to the model update strategy, wherein the model update strategy is executed using at least one of the following:

the battery model, optimization methods, machine learning, and artificial intelligence or any combination thereof using as an input at least one of the following:

the at least one SoX parameter, the at least one SoX descriptor and the at least one SoX value, values of an at least one previous SoX parameter, an at least one previous SoX descriptor and an at least one previous SoX value, at least one parameter from a battery control unit or a control unit of the system, in which battery is integrated, or a combination thereof wherein the model update loop further carries out at least one of the following steps:

identification of model parameters, estimation of state variables, battery model structure update and model conversion on at least one of the following: local hardware with appropriate data support and adequate artificial intelligence methods for complex nonlinear battery modelling, optimization methods and machine learning algorithms procedures from a remote processing backend.

10. The method of claim 1, wherein updating the battery model includes the step of using a battery model selection procedure which comprises at least one of the following:
- performing an automatic conversion of an updated battery model into a family of substitutions of linearized battery models,
- verifying the specific properties of substitutions models such as model controllability, observability, frequency characteristic, and stability,
- using mathematical metrics, such as Hinf, H2, Linf and LQG, for comparative criteria when selecting the optimal substitution of the battery model,
- automatically calculating or determining one or more associated observers for the selected model according to the needs of SoX calculations for the battery.

11. The method of claim 1, wherein at least one of the following: the at least one SoX value, the at least one SoX descriptor and the at least one SoX parameter are transferred to at least one of the following: a battery management system, other device for regulating and controlling battery operation and device for storing battery data.

12. The method of claim 1, which is executed or executable on at least one of the following: a stand-alone device for diagnosing SoX, a BMS, a digital twin, a cloud-based service and other product or application or service; to manage the battery.

13. The method according to claim 1, where all processes are executed on at least one of the following: a single physically integrated hardware, more distributed hardware systems and systems including remote, e.g. cloud services.

14. The method according to claim 1, where all data is being stored on at least one of the following: a single physically integrated hardware, one or more distributed hardware systems and systems including remote, e.g. cloud services.

15. The method of claim 1, wherein the battery model is a physicochemically based battery model which models transport and electrochemical and, optionally, heat generation phenomena and degradation phenomena of a physical battery.

16. The method of claim 1, wherein a measuring module, optionally included in the model update loop, determines an excitation sequence for an electrochemical impedance spectroscopy—EIS—measurement based on the inputs from a model update strategy, wherein the measuring module is configured to carry out a measurement on the battery to obtain as a response at least one AC signal, wherein, optionally, the method further comprises processing the at least one AC signal.

17. The method of claim 1, wherein the at least one measured battery parameter represents at least one of the following:
- a set of AC data, such as obtained from tailoring of AC measurements in terms of the shape of a measurement signal, frequency range, amplitude and duration of the measurement procedure,
- a set of DC data, such as obtained from measurements at different electrical currents and in between different SoX values,
- superimposition of any type of AC and DC signals; that comprises sufficient information to determine with high level of accuracy and uniqueness some or all of the SoX parameters, SoX descriptors and SoX values during at least on the following: normal battery operation in a specific device and battery measurements in dedicated conditions.

18. A computer-implemented method comprising a decision-making module which is configured to determine which SoX value of a battery from one or more SoXs selected from the group consisting of State-of-Charge (SoC), State-of-Health (SoH), State-of-Energy (SoE), State-of-Power (SoP), State-of-Function (SoF) and State-of-Safety (SoS) shall be updated, wherein the SoX value that shall be updated is determined based on at least one of the following:
- at least one SoX descriptor associated with the SoX value,
- a processing engine which comprises at least one of the following: mechanistically or physically based models of the battery, for example a physicochemically based battery model, machine learning methods, artificial intelligence or any combination of these as well as any type of optimization methods,
- a trigger provided from outside to the decision-making module, in particular by a battery control unit used to control the battery or a control unit of a system, into which the battery is integrated,
- a trigger provided in the decision-making module.

19. A computer-implemented method, comprising a model update module for updating a battery model for diagnosing one or more SoXs selected from the group consisting of State-of-Charge (SoC), State-of-Health (SoH), State-of-Energy Page 8 of 15 (SoE), State-of-Power (SoP), State-of-Function (SoF) and State-of-Safety (SoS) of at least one battery, wherein the model update module is configured to determine a model update strategy for updating the battery model based on at least one of the following:
- at least one SoX parameter, at least one SoX descriptor, and at least one SoX value, wherein the at least one SoX parameter is one of the following: at least one measured battery parameter of the battery, at least one simulated battery parameter provided by the battery model, at least one state variable and at least one model parameter of the battery model,
- a processing engine comprising at least one of the following: mechanistically or physically based models of the battery, such as a physicochemically based battery model, machine learning methods, artificial intelligence or any combination of these as well as any type of optimization methods,—external triggers and inputs to the model update module from:
- a battery control unit or control unit of the system, in which the battery is integrated, and a predetermined update sequence; and the model update module is further configured to identify at least one of the following: model parameters, state variables and model structure, that need to be updated.

20. A computer-implemented method of diagnosing one or more SoXs selected from the group consisting of State-of-Charge (SoC), State-of-Health (SoH), State-of-Energy (SoE), State-of-Power (SoP), State-of-Function (SoF) and State-of-Safety (SoS), of at least one battery, the method comprising a SoX diagnostics loop, which includes a given battery model, and a model update loop, which is configured to update the battery model, the method comprising the steps, carried out in the SoX diagnostics loop:
- receiving, by the SoX diagnostics loop from at least one sensor, at least one measured battery parameter of the battery,
- calculating at least one simulated battery parameter corresponding to the at least one measured battery parameter by using a given battery model,
- determining at least one state variable of the battery model, calculating the at least one SoX descriptor of the battery using at least one of the following: at least one SoX parameter, at least one comparison of the at least one SoX parameter: to its previous value, to the at least one another SoX parameter, to the at least one threshold value, wherein the at least one SoX parameter is one of the following: the at least one measured battery parameter, at least one simulated battery parameter provided by the battery model, the at least one state variable and at least one model parameter of the battery model, determining which SoX value of the battery from one or more predetermined SoXs shall be updated, based on at least one of the following: the SoX descriptor, the battery model, a triggering from any battery control unit or control unit of the system, in which battery is integrated, a predetermined SoX update sequence, determining a SoX value of at least one SoX, using the at least one of the following:SoX descriptor, SoX parameter and none or at least one of the following: mechanistically based methods, including physicochemically based battery model, machine learning methods, artificial intelligence and any combination of these methods as well as any type of optimization methods and comparative algorithms, providing the at least one SoX value, the at least one SoX descriptor and at least one SoX parameter to at least one of the following: a battery management system, other device for regulating and controlling battery operation and device for storing battery data, determining, by the SoX diagnostics loop, based on at least one of the following: at least one SoX parameter, the at least one SoX descriptor and the at least one SoX value, whether the model is still adequate or if accuracy of the model is not sufficient and an update is to be carried out on the model, in response to determining that the update is to be carried out on the model, entering the model update loop, and the method comprises the steps, carried out in the model update loop:

determining a model update strategy for updating the battery model based on at least one of the following:
  the at least one SoX parameter, the at least one SoX descriptor, or the at least one SoX value,
  a processing engine incorporated in or accessible by the SoX diagnostics loop, wherein the processing engine comprising at least one of the following: mechanistically or physically based models, for example a physicochemically based battery model, machine learning methods, artificial intelligence or any combination of these as well as any type of optimization methods,
  external triggers and inputs to the model update module from:
    any battery control unit or control unit of the system, in which battery is integrated,
    a predetermined update sequence;

updating the battery model according to the model update strategy, wherein the model update loop further carries out at least one of the following steps:Identification of model parameters, estimation of state variables, battery model structure;

providing, by the model update loop, the updated battery model to the SoX diagnostics loop.

* * * * *